US012593463B2

(12) United States Patent
Chen et al.

(10) Patent No.: US 12,593,463 B2
(45) Date of Patent: Mar. 31, 2026

(54) SEMICONDUCTOR DEVICE WITH PROTECTIVE GATE STRUCTURE AND METHODS OF FABRICATION THEREOF

(71) Applicant: TAIWAN SEMICONDUCTOR MANUFACTURING COMPANY, LTD., Hsinchu (TW)

(72) Inventors: Yi-Ren Chen, Taoyuan (TW); Chung-Ting Li, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 561 days.

(21) Appl. No.: 18/097,274

(22) Filed: Jan. 15, 2023

(65) Prior Publication Data

US 2024/0178302 A1     May 30, 2024

Related U.S. Application Data

(60) Provisional application No. 63/428,645, filed on Nov. 29, 2022.

(51) Int. Cl.
| | |
|---|---|
| *H01L 29/66* | (2006.01) |
| *H01L 29/06* | (2006.01) |
| *H01L 29/417* | (2006.01) |
| *H01L 29/423* | (2006.01) |
| *H01L 29/775* | (2006.01) |
| *H10D 30/01* | (2025.01) |
| *H10D 30/43* | (2025.01) |
| *H10D 30/67* | (2025.01) |
| *H10D 62/10* | (2025.01) |

(52) U.S. Cl.
CPC ....... *H10D 30/0215* (2025.01); *H10D 30/014* (2025.01); *H10D 30/43* (2025.01); *H10D 30/6729* (2025.01); *H10D 30/6735* (2025.01); *H10D 62/121* (2025.01)

(58) Field of Classification Search
CPC .. H10D 30/0215; H10D 30/014; H10D 30/43; H10D 30/6729; H10D 30/6735; H10D 62/121; H10D 30/797; H10D 30/6757; H10D 62/822; H10D 64/017; H10D 64/251; B82Y 10/00
USPC ....................................................... 257/347
See application file for complete search history.

(56) References Cited

U.S. PATENT DOCUMENTS

| | | | |
|---|---|---|---|
| 9,105,490 B2 | 8/2015 | Wang et al. |
| 9,236,267 B2 | 1/2016 | De et al. |
| 9,236,300 B2 | 1/2016 | Liaw |

(Continued)

*Primary Examiner* — Tong-Ho Kim
(74) *Attorney, Agent, or Firm* — NZ Carr Law Office

(57) ABSTRACT

A semiconductor device structure is provided. The semiconductor device structure includes a substrate having a first side and a second side opposing the first side, a source/drain epitaxial feature disposed adjacent the first side of the substrate, wherein the source/drain epitaxial feature comprises a first epitaxial layer, a second epitaxial layer in contact with the first epitaxial layer, and a third epitaxial layer having sidewalls surrounded by and in contact with the second epitaxial layer. The device structure also includes a first silicide layer in contact with the substrate, the first, second, and third epitaxial layers, a first source/drain contact extending through the substrate from the first side to the second side, and a first metal capping layer disposed between the first silicide layer and the first source/drain contact.

20 Claims, 26 Drawing Sheets

(56) References Cited

U.S. PATENT DOCUMENTS

| | | | |
|---|---|---|---|
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 * | 1/2017 | Ho | H10D 84/0149 |
| 9,576,814 B2 | 2/2017 | Wu et al. | |
| 9,831,183 B2 | 11/2017 | Lin et al. | |
| 9,859,386 B2 | 1/2018 | Ho et al. | |
| 2021/0126134 A1 * | 4/2021 | Ferng | H01L 21/30604 |

* cited by examiner

100

121

119

118

101

104

106
108
106
108
106
108

123

110
110b
110a

103

123

123

117

116

100

127 { 125 121 119 118

101

104 { 106 108 106 108 106 108

103

117

116

SEMICONDUCTOR DEVICE WITH PROTECTIVE GATE STRUCTURE AND METHODS OF FABRICATION THEREOF

CROSS-REFERENCE TO RELATED APPLICATIONS

This application claims priority to U.S. Provisional Application Ser. No. 63/428,645 filed Nov. 29, 2022, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge. For example, the tight separation between source/drain contacts and the gate is prone to overlay related contact-to-gate shorts. While the gate can be capped with an insulator (e.g., self-aligned contact (SAC)) that is compositionally different from the contact dielectric to protect the gate against a misaligned diffusion contact etch, the metal gate etch back process is easily suffered from defects or gate materials being remained at around the SAC, which can result in gate-induced source/drain contact leakage or even source/drain via contact to gate leakage.

Therefore, an improved device structure that can address the issues above is needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
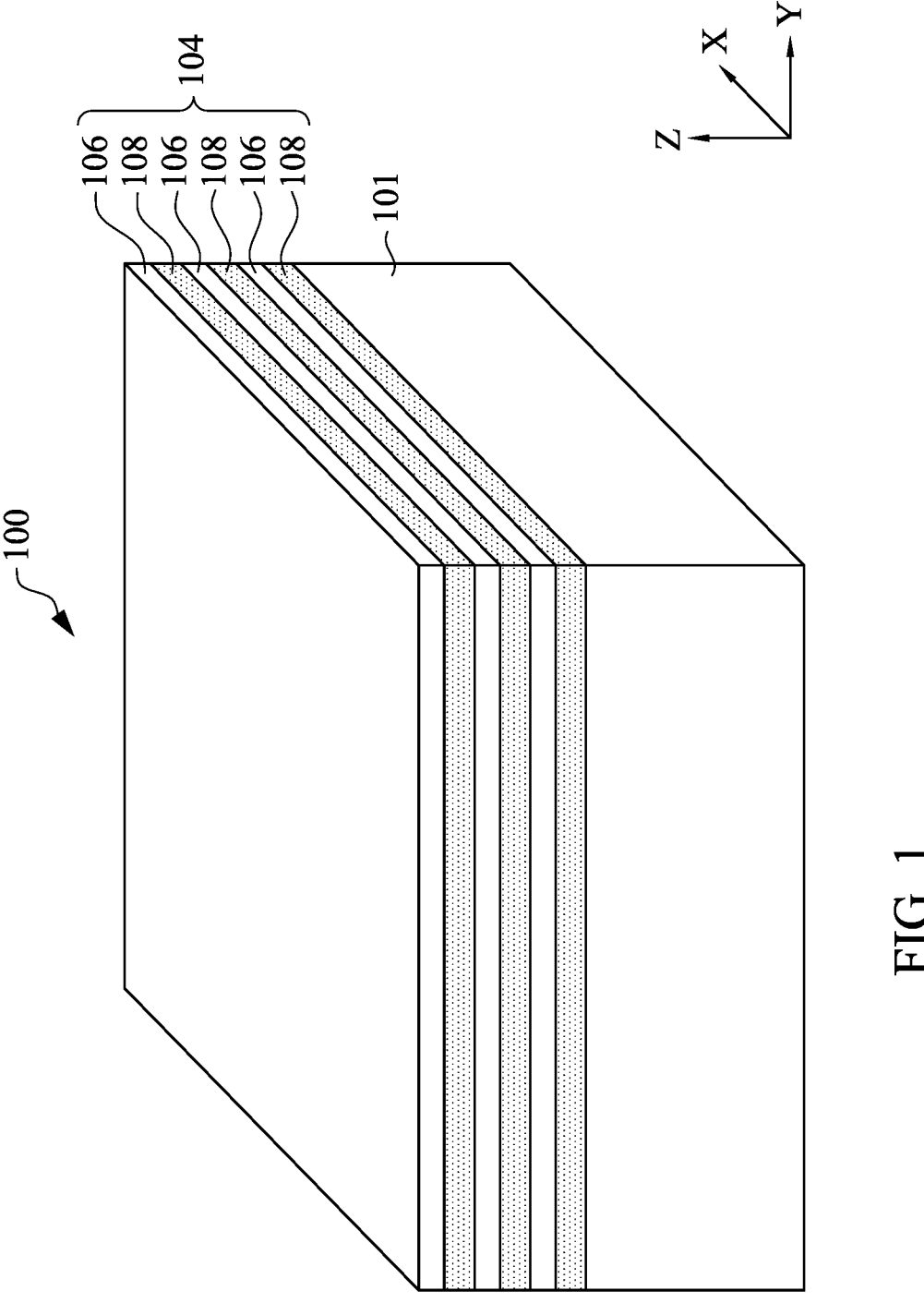
FIGS. 1-8 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanosheet FETs, implementations of some aspects of the present disclosure may be used in other processes and/or in other devices, such as planar FETs, FinFETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-37 show exemplary processes for manufacturing a semiconductor device structure 100 according to embodiments of the present disclosure. It is understood that additional operations can be provided before, during, and after processes shown by FIGS. 1-37, and some of the operations described below can be replaced or eliminated, for additional embodiments of the method. The order of the operations/processes is not limiting and may be interchangeable.

FIGS. 1-8 are perspective views of various stages of manufacturing a semiconductor device structure 100 in accordance with some embodiments. As shown in FIG. 1, the semiconductor device structure 100 includes a stack of semiconductor layers 104 formed over a substrate 101. The substrate 101 may be a semiconductor substrate. The substrate 101 may include a crystalline semiconductor material such as, but not limited to, silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In one embodiment, the substrate 101 is made of silicon. In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type impurities). Depending on circuit design, the dopants may be, for example boron for p-type field effect transistors (p-type FETs) and phosphorus for n-type field effect transistors (n-type FETs).

The stack of semiconductor layers 104 includes semiconductor layers made of different materials to facilitate formation of nanosheet channels in a multi-gate device, such as nanosheet FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108, and the first and second semiconductor layers 106, 108 are disposed parallelly with each other. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. In some embodiments, the first semiconductor layers 106 may be made of SiGe having a first Ge concentration range, and the second semiconductor layers 108 may be made of SiGe having a second Ge concentration range that is lower or greater than the first Ge concentration range. In any case, the second semiconductor layers 108 may have a Ge concentration in a range between about 20% and 30%.

The thickness of the first semiconductor layers 106 and the second semiconductor layers 108 may vary depending on the application and/or device performance considerations. In some embodiments, each first and second semiconductor layer 106, 108 may have a thickness in a range between about 5 nm and about 30 nm. Each second semiconductor layer 108 may have a thickness that is equal to, less than, or greater than the thickness of the first semiconductor layer 106. In some embodiments, each first semiconductor layer 106 has a thickness in a range between about 10 nm and about 30 nm, and each second semiconductor layer 108 has a thickness in a range between about 5 nm to about 20 nm. The second semiconductor layers 108 may eventually be removed and serve to define a vertical distance between adjacent channels for the semiconductor device structure 100.

The first semiconductor layers 106 or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. The semiconductor device structure 100 may include a nanosheet transistor. The nanosheet transistors may be referred to as nanosheet transistors, nanowire transistors, gate-all-around (GAA) transistors, multi-bridge channel (MBC) transistors, or any transistors having the gate electrode surrounding the channels. The use of the first semiconductor layers 106 to define channels of the semiconductor device structure 100 is further discussed below.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes. While three first semiconductor layers 106 and three second semiconductor layers 108 are alternately arranged as illustrated in FIG. 1, it can be appreciated that any number of first and second semiconductor layers 106, 108 can be formed in the stack of semiconductor layers 104, depending on the predetermined number of nanosheet channels for each FET. For example, the number of first semiconductor layers 106, which is the number of channels, may be between 2 and 8.

The semiconductor device structure 100 further includes a sacrificial layer 111 disposed below the stack of semiconductor layers 104. In some embodiments, the sacrificial layer 111 is disposed in the substrate 101 at an elevation about 40 nm to about 80 nm below the bottommost second semiconductor layer 108 of the stack of semiconductor layers 104. The sacrificial layer 111 serves as a planarization termination layer during the backside planarization process to prevent the planarization process from removing or damaging subsequently formed source/drain features 146 (see FIG. 11). The material of the sacrificial layer 111 is chosen such that it has a different etch selectivity and/or oxidation rates with respect to the material (e.g., silicon) of the substrate 101. In various embodiments, the sacrificial layer 111 is a silicon germanium (SiGe) layer. The SiGe layer may be a non-graded SiGe layer. In some embodiments, the sacrificial layer 111 is a graded SiGe layer where a germanium concentration varies in a range between about 20% and 30% with the distance away from the interface of the bottommost second semiconductor layer 108 and the substrate 101. The sacrificial layer 111 may have a thickness greater than the thickness of the second semiconductor layer 108. In some embodiments, the sacrificial layer 111 may have a thickness in a range between about 5 nm and about 20 nm. The sacrificial layer 111 may be deposited using the same deposition technique as the second semiconductor layer 108.

Figure 2:
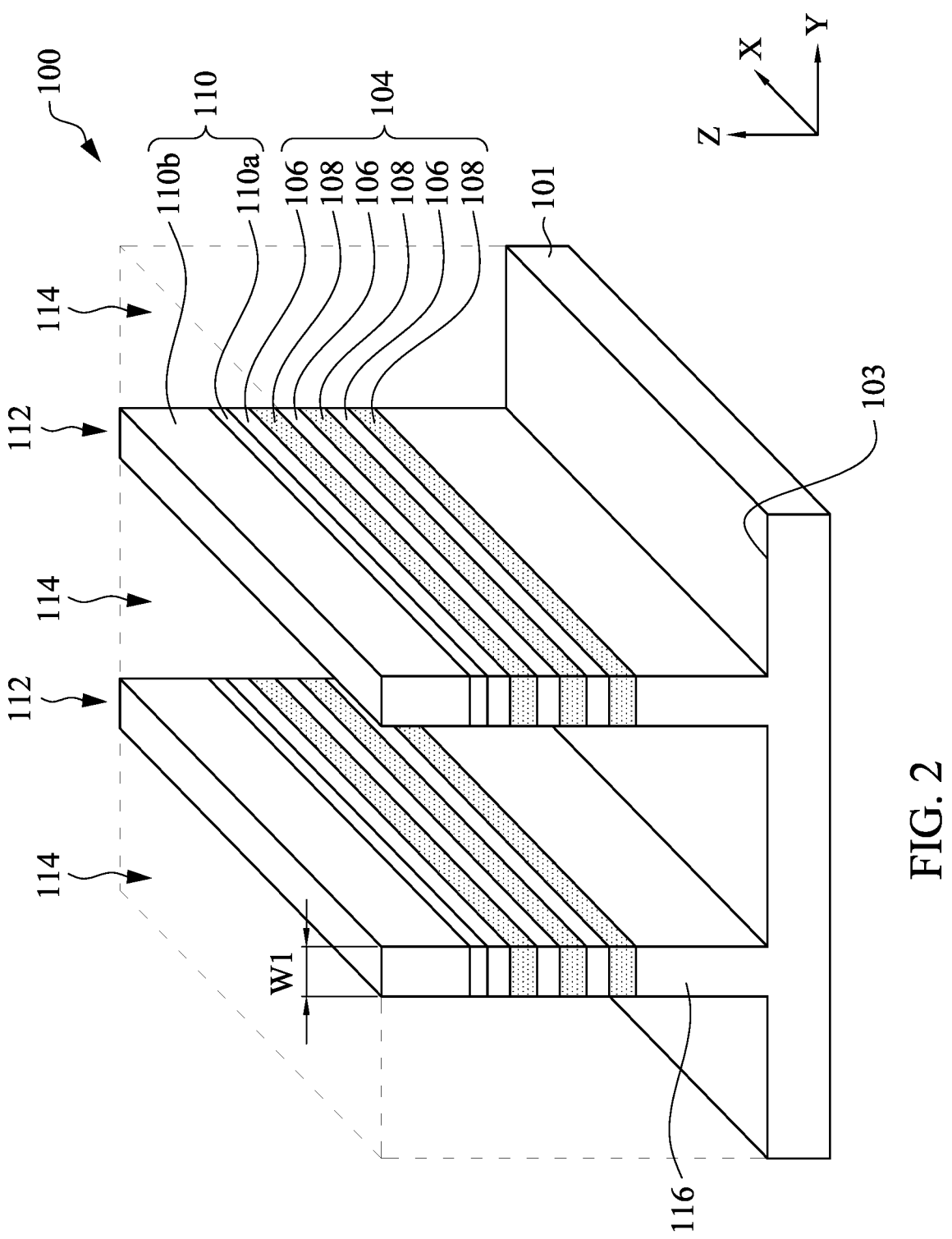

In FIG. 2, fin structures 112 are formed from the stack of semiconductor layers 104 and the sacrificial layer 111. Each fin structure 112 has a portion including the semiconductor layers 106, 108, the sacrificial layer 111, a well portion 116 formed from the substrate 101, and a portion of a mask structure 110. The mask structure 110 is formed over the stack of semiconductor layers 104 prior to forming the fin structures 112. The mask structure 110 may include a pad layer 110a and a hard mask 110b. The pad layer 110a may be an oxygen-containing layer, such as a $SiO_2$ layer. The hard mask 110b may be a nitrogen-containing layer, such as a $Si_3N_4$ layer. The mask structure 110 may be formed by any suitable deposition process, such as chemical vapor deposition (CVD) process.

The fin structures 112 may be fabricated using suitable processes including photolithography and etch processes. In some embodiments, the photolithography process may include forming a photoresist layer (not shown) over the mask structure 110, exposing the photoresist layer to a pattern, performing post-exposure bake processes, and developing the photoresist layer to form a patterned photoresist layer. The patterned photoresist layer may then be used to protect regions of the substrate 101 and layers formed thereupon, while an etch process forms trenches 114 in unprotected regions through the mask structure 110, the stack of semiconductor layers 104, the sacrificial layer 111 and into the substrate 101, thereby forming the extending fin structures 112. A width W1 of the fin structures 112 along the Y direction may be in a range between about 3 nm and about 44 nm. The trenches 114 may be etched using a dry etch (e.g., RIE), a wet etch, and/or combination thereof. While two fin structures 112 are shown, the number of the fin structures is not limited to two.

Figure 3:
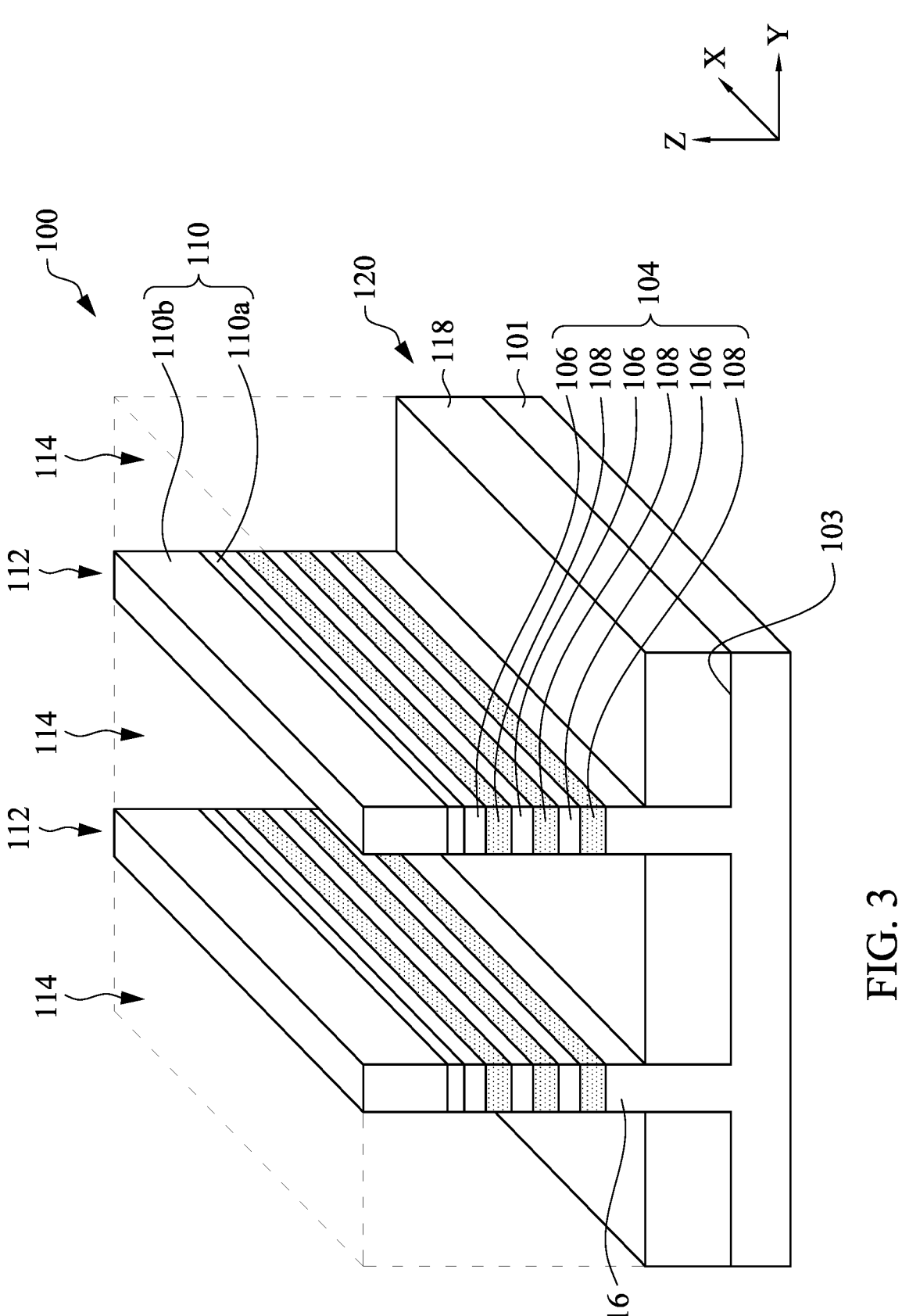

In FIG. 3, after the fin structures 112 are formed, an insulating material 118 is formed in the trenches 114 between the fin structures 112. The insulating material 118 fills the trenches 114 between neighboring fin structures 112 until the fin structures 112 are embedded in the insulating material 118. Then, a planarization operation, such as a chemical mechanical polishing (CMP) process and/or an etch-back process, is performed to expose the top of the fin structures 112. The insulating material 118 may be made of silicon oxide, silicon nitride, silicon oxynitride (SiON), SiOCN, SiCN, fluorine-doped silicate glass (FSG), a low-k dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Next, the insulating material 118 is recessed to form an isolation region 120. The recess of the insulating material 118 exposes portions of the fin structures 112. The isolation region 120 may be formed using a suitable process, such as a dry etching process, a wet etching process, or a combination thereof. As a result of the recess process, a top surface of the insulating material 118 may be at or slightly below a surface defined by the bottommost second semiconductor layer 108 and the well portion 116.

Figure 4:
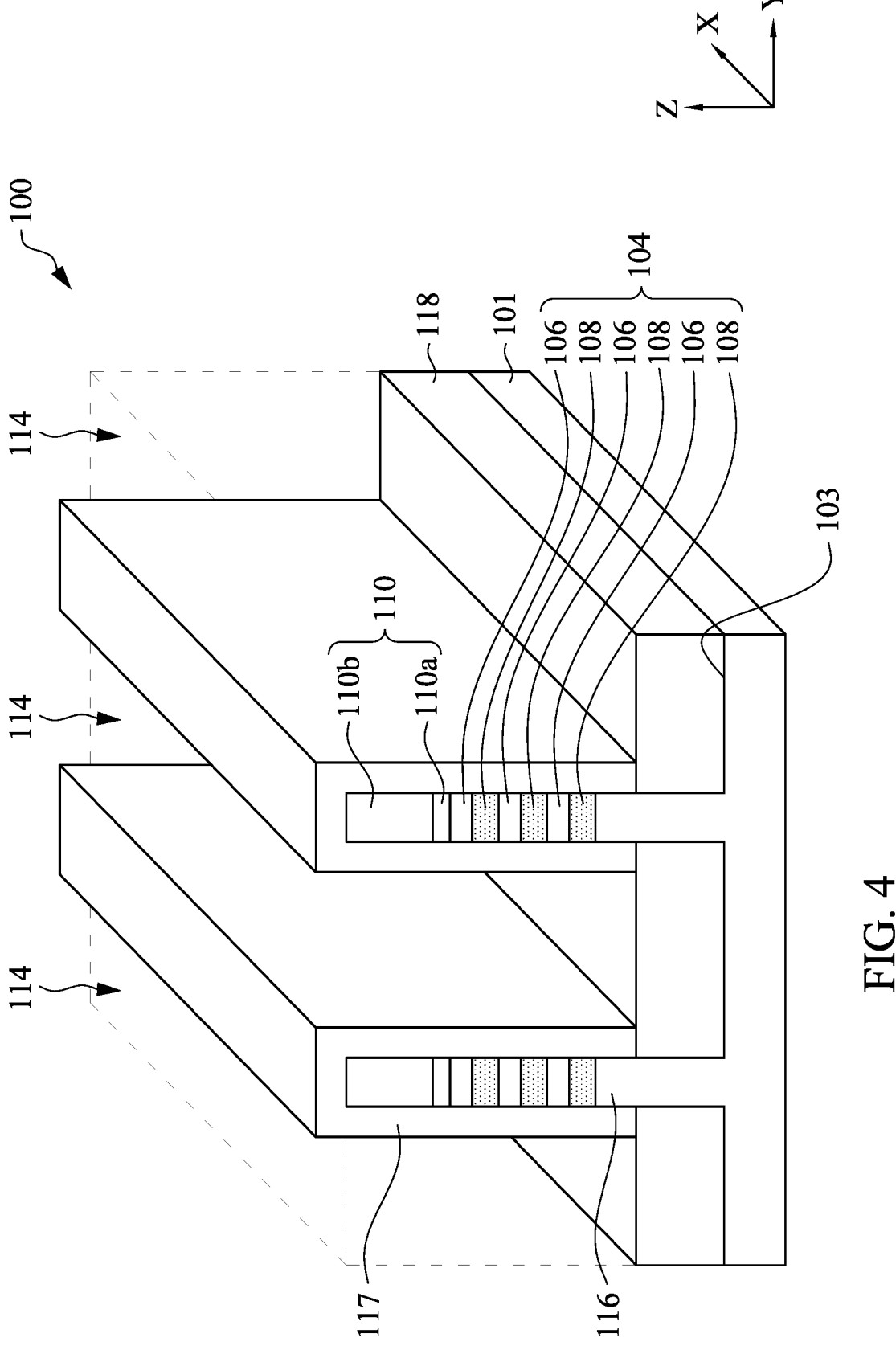

In FIG. 4, a cladding layer 117 is formed by an epitaxial process over exposed portion of the fin structures 112. In some embodiments, a semiconductor liner (not shown) may be first formed over the fin structures 112, and the cladding layer 117 is then formed over the semiconductor liner. The semiconductor liner may be diffused into the cladding layer 117 during the formation of the cladding layer 117. In either case, the cladding layer 117 is in contact with the stack of semiconductor layers 104. In some embodiments, the cladding layer 117 and the second semiconductor layers 108 include the same material having the same etch selectivity. For example, the cladding layer 117 and the second semiconductor layers 108 may be or include SiGe. The cladding layer 117 and the second semiconductor layers 108 may be removed subsequently to create space for the subsequently formed gate electrode layer.

Figure 5:
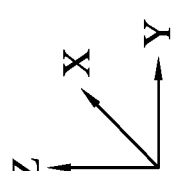

In FIG. 5, a liner 119 is formed on the cladding layer 117 and the top surface of the insulating material 118. The liner 119 may include a material having a k value lower than 7, such as $SiO_2$, SiN, SiCN, SiOC, or SiOCN. The liner 119 may be formed by a conformal process, such as an ALD process. A dielectric material 121 is then formed in the trenches 114 (FIG. 4) and on the liner 119. The dielectric material 121 may be an oxygen-containing material, such as an oxide, formed by FCVD. The oxygen-containing material may have a k value less than about 7, for example less than about 3. A planarization process, such as a CMP process, may be performed to remove portions of the liner 119 and the dielectric material 121 formed over the fin structures 112. The portion of the cladding layer 117 disposed on the hard mask 110b is exposed after the planarization process.

Next, the liner 119 and the dielectric material 121 are recessed to the level of the topmost first semiconductor layer

6

106. For example, in some embodiments, after the recess process, the top surfaces of the liner 119 and the dielectric material 121 may be level with a top surface of the uppermost first semiconductor layer 106. The recess processes may be selective etch processes that do not substantially affect the semiconductor material of the cladding layer 117. As a result of the recess process, trenches 123 are formed between the fin structures 112.

Figure 6:
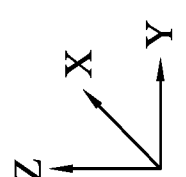

In FIG. 6, an optional dielectric material 125 is formed in the trenches 123 (FIG. 5) and on the dielectric material 121 and the liner 119. The dielectric material 125 may include SiO, SiN, SiC, SiCN, SION, SiOCN, AlO, AlN, AlON, ZrO, ZrN, ZrAlO, HfO, or other suitable dielectric material. In some embodiments, the dielectric material 125 includes a high-k dielectric material (e.g., a material having a k value greater than 7). The dielectric material 125 may be formed by any suitable process, such as a CVD, PECVD, FCVD, or ALD process. A planarization process, such as a CMP process, is performed until the hard mask 110b of the mask structure 110 is exposed. The planarization process removes portions of the dielectric material 125 and the cladding layer 117 disposed over the mask structure 110. The liner 119, the dielectric material 121, and the dielectric material 125 together may be referred to as a dielectric feature 127 or a hybrid fin. The dielectric feature 127 serves to separate subsequent formed source/drain (S/D) epitaxial features and adjacent gate electrode layers.

Figure 7:
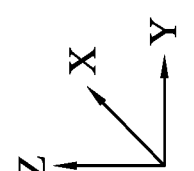

In FIG. 7, the cladding layers 117 are recessed, and the mask structures 110 are removed. The recess of the cladding layers 117 may be performed by any suitable process, such as dry etch, wet etch, or a combination thereof. The recess process may be controlled so that the remaining cladding layers 117 are substantially at the same level as the top surface of the uppermost first semiconductor layer 106 in the stack of semiconductor layers 104. The etch process may be a selective etch process that does not substantially affect the dielectric material 125. The removal of the mask structures 110 may be performed by any suitable process, such as dry etch, wet etch, or a combination thereof.

Figure 8:
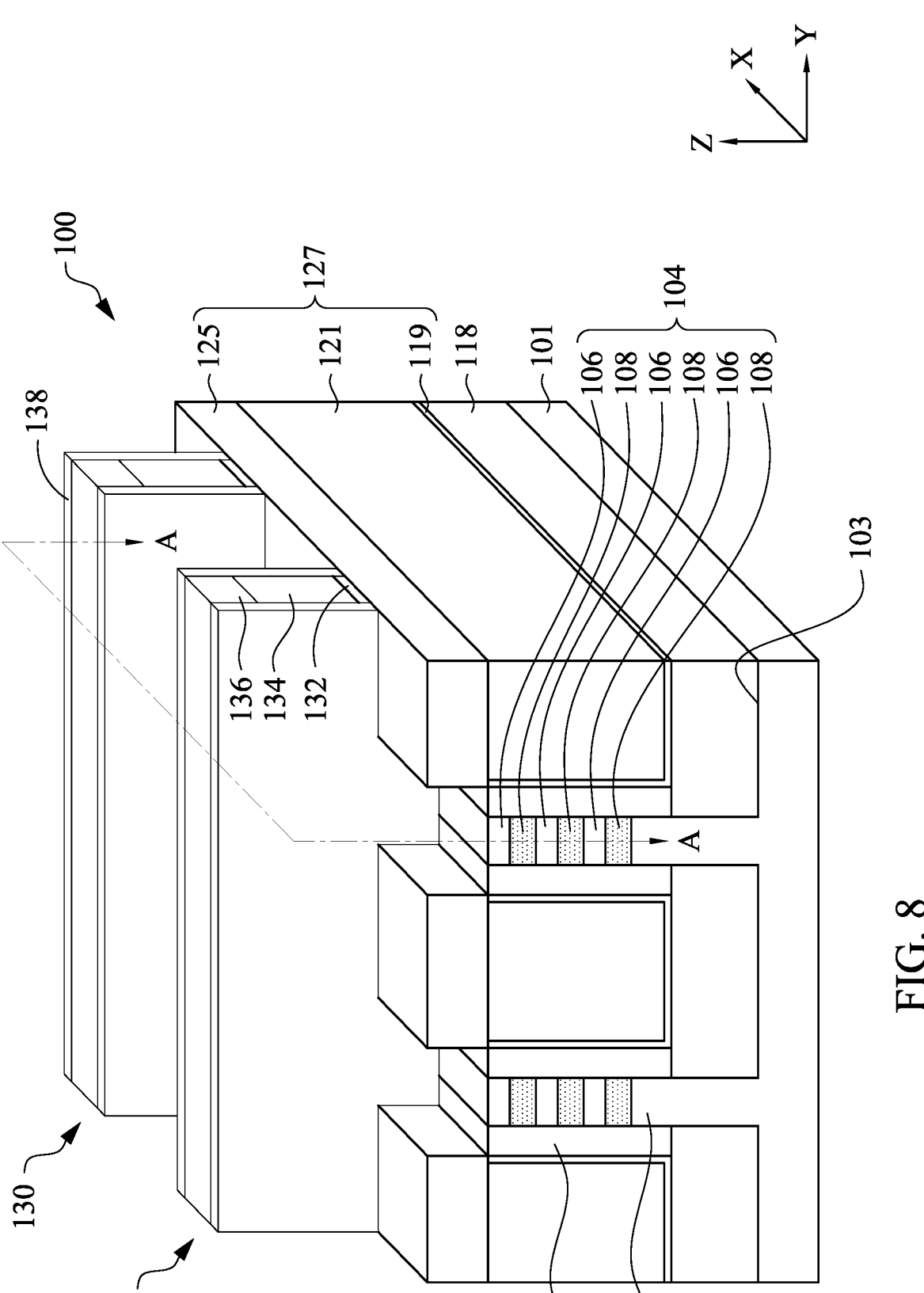

In FIG. 8, one or more sacrificial gate structures 130 (only two is shown) are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof.

By patterning the sacrificial gate structure 130, the stacks of semiconductor layers 104 of the fin structures 112 are partially exposed on opposite sides of the sacrificial gate structure 130. The portions of the fin structures 112 that are covered by the sacrificial gate electrode layer 134 of the sacrificial gate structure 130 serve as channel regions for the semiconductor device structure 100. The fin structures 112 that are partially exposed on opposite sides of the sacrificial gate structure 130 define source/drain (S/D) regions for the semiconductor device structure 100. While two sacrificial gate structures 130 are shown, three or more sacrificial gate structures 130 may be arranged along the X direction in some embodiments.

Next, gate spacers 138 are formed on sidewalls of the sacrificial gate structures 130. The gate spacers 138 may be formed by first depositing a conformal layer that is subsequently etched back to form sidewall gate spacers 138. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fin structures 112, the cladding layer 117, the dielectric material 125, leaving the gate spacers 138 on the vertical surfaces, such as the sidewalls of sacrificial gate structures 130. The gate spacer 138 may be made of a dielectric material such as silicon oxide, silicon nitride, silicon carbide, silicon oxynitride, SiCN, silicon oxycarbide, SiOCN, and/or combinations thereof.

In some embodiments where the cladding layers 117 and the dielectric features 127 are not present, portions of the sacrificial gate structures 130 and the gate spacers 138 are formed on the insulating material 118, and gaps are formed between exposed portions of the fin structures 112.

Figures 9, 10:
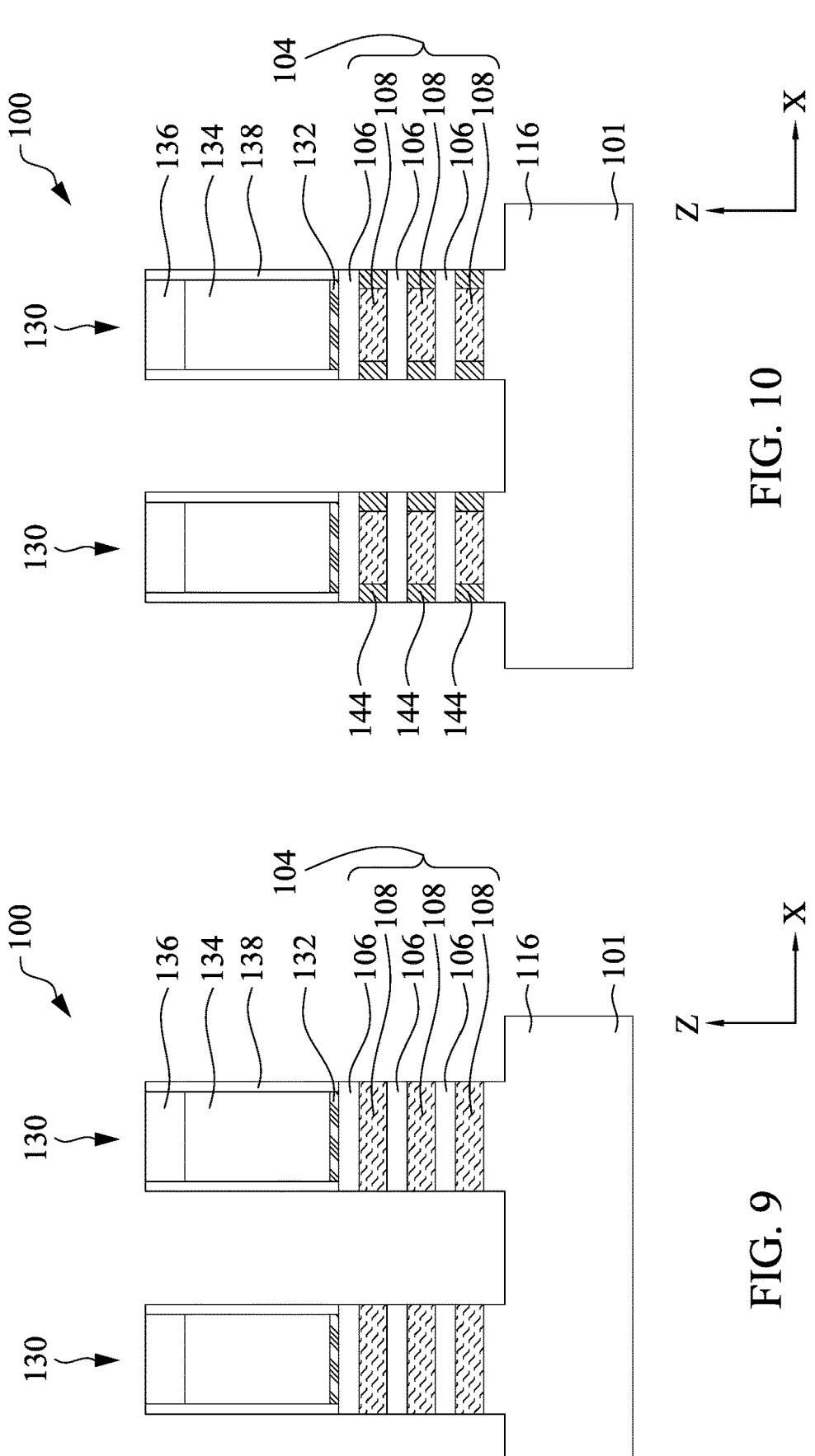
FIGS. 9-37 are cross-sectional side views of various stages of manufacturing the semiconductor device structure taken along cross-section A-A of FIG. 8, in accordance with some embodiments.

FIGS. 9-24 are cross-sectional side views of various stages of manufacturing the semiconductor device structure 100 taken along cross-section A-A of FIG. 8, in accordance with some embodiments. Cross-section A-A is in a plane of the fin structure 112 along the X direction. In FIG. 9, exposed portions of the fin structures 112, exposed portions of the cladding layers 117, and a portion of the exposed dielectric material 125 not covered by the sacrificial gate structures 130 and the gate spacers 138 are selectively recessed by using one or more suitable etch processes, such as dry etch, wet etch, or a combination thereof. In some embodiments, exposed portions of the stacks of semiconductor layers 104 of the fin structures 112 are removed, exposing portions of the well portions 116. As shown in FIG. 9, the exposed portions of the fin structures 112 are recessed to a level at or slightly below the bottom surface of the second semiconductor layer 108 in contact with the well portion 116 of the substrate 101. The recess processes may include an etch process that recesses the exposed portions of the fin structures 112 and the exposed portions of the cladding layers 117.

In FIG. 10, edge portions of each second semiconductor layer 108 of the stack of semiconductor layers 104 are removed horizontally along the X direction. The removal of the edge portions of the second semiconductor layers 108 forms cavities. In some embodiments, the portions of the second semiconductor layers 108 are removed by a selective wet etching process. In cases where the second semiconductor layers 108 are made of SiGe and the first semiconductor layers 106 are made of silicon and/or SiGe having lower germanium concentration than the second semiconductor layers 108, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers 144. The dielectric spacers 144 may be made of SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The remaining second semiconductor layers 108 are capped between the dielectric spacers 144 along the X direction.

Figure 11:
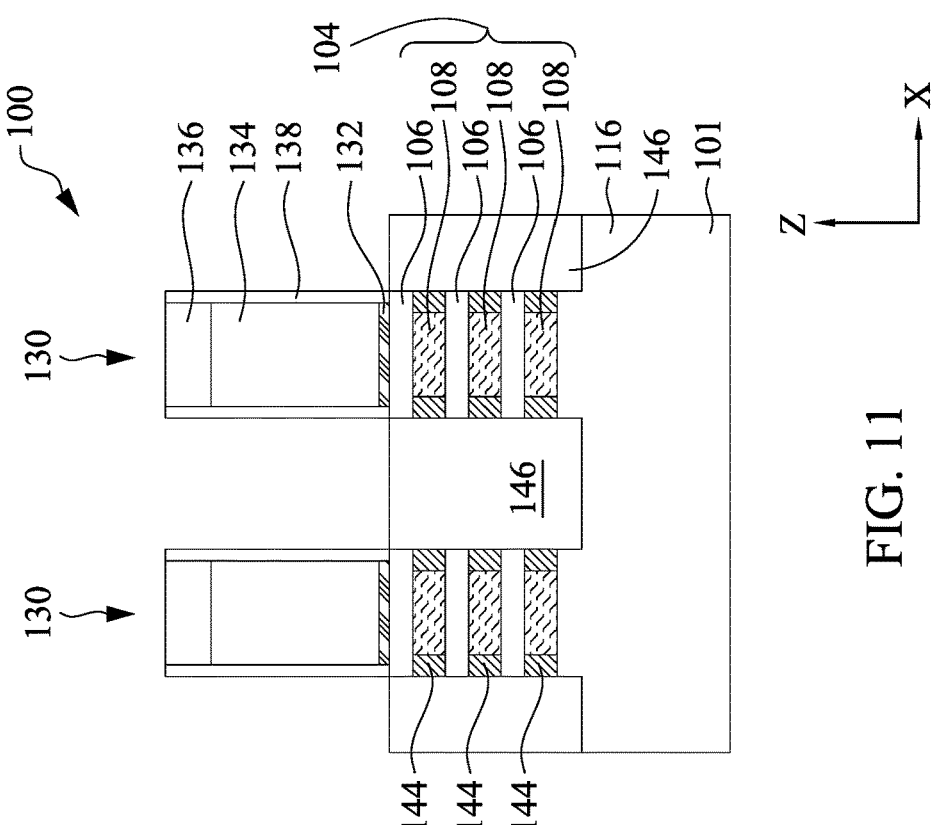

In FIG. 11, after formation of the dielectric spacers 144, S/D epitaxial features 146 are formed in the S/D regions between the neighboring sacrificial gate structures 130. The S/D epitaxial features 146 may grow laterally from the first semiconductor layers 106. The shape of the S/D epitaxial features 146 is confined by the dielectric feature 127. The S/D epitaxial feature 146 may include one or more layers of Si, SiP, SiC and SiCP for an n-type FET or Si, SiGe, Ge for a p-type FET. The S/D epitaxial features 146 may be formed by an epitaxial growth method using selective epitaxial growth (SEG), CVD, ALD or MBE. In cases where embodiments of FIGS. 11A and 11A-1 are adapted, the S/D epitaxial features 146 are in contact with the dielectric regions 135, the first semiconductor layers 106, and dielectric spacers 144. The S/D epitaxial features 146 may be the S/D regions. For example, one of a pair of S/D epitaxial features 146 located on one side of the sacrificial gate structures 130 may be a source region, and the other of the pair of S/D epitaxial features 146 located on the other side of the sacrificial gate structures 130 may be a drain region. A pair of S/D epitaxial features 146 includes a source epitaxial feature 146 and a drain epitaxial feature 146 connected by the channels (i.e., the first semiconductor layers 106). Source/drain region(s) may refer to a source or a drain, individually or collectively dependent upon the context. In this disclosure, a source and a drain are interchangeably used, and the structures thereof are substantially the same.

Figure 12:
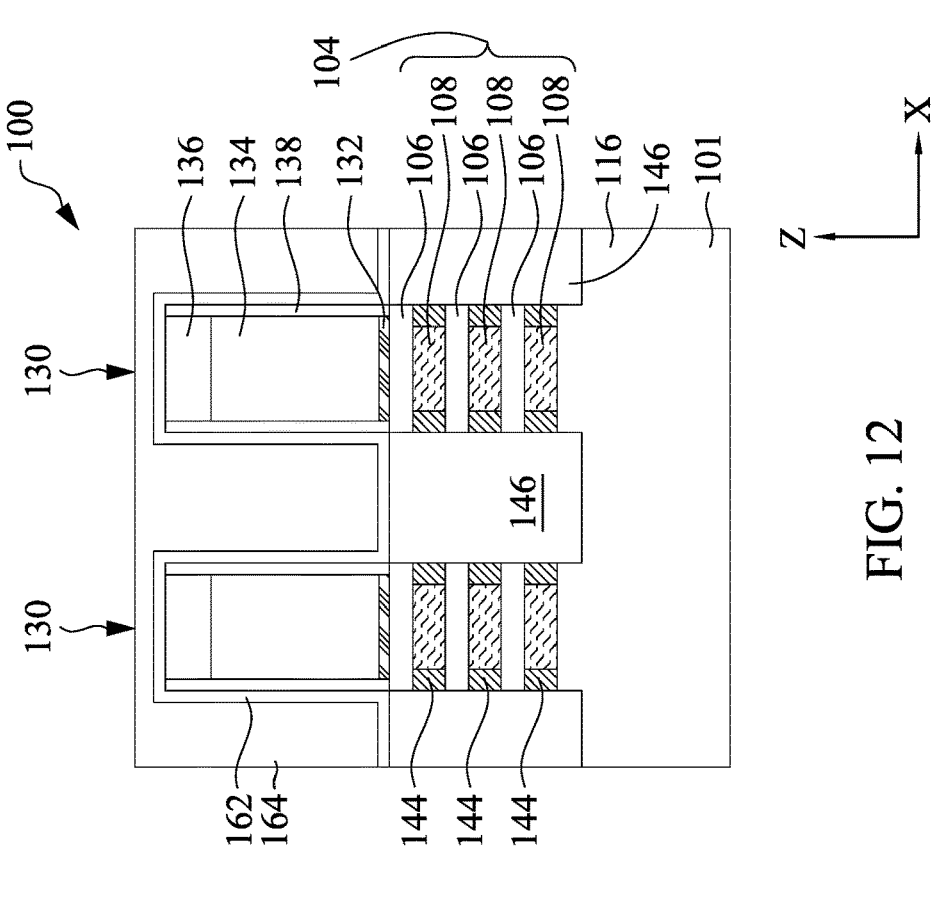

In FIG. 12, after formation of the S/D epitaxial features 146, a contact etch stop layer (CESL) 162 is conformally formed on the exposed surfaces of the semiconductor device structure 100. The CESL 162 covers the exposed surfaces of the S/D epitaxial features 146 and the sacrificial gate structures 130 (e.g., mask layer 136). The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, a first interlayer dielectric (ILD) layer 164 is formed on the CESL 162 over the semiconductor device structure 100. The materials for the first ILD layer 164 may include oxide formed with tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials comprising Si, O, C, and/or H. The first ILD layer 164 may be deposited by a PECVD process or other suitable deposition technique. In some embodiments, after formation of the first ILD layer 164, the semiconductor device structure 100 may be subject to a thermal process to anneal the first ILD layer 164.

Figure 13:
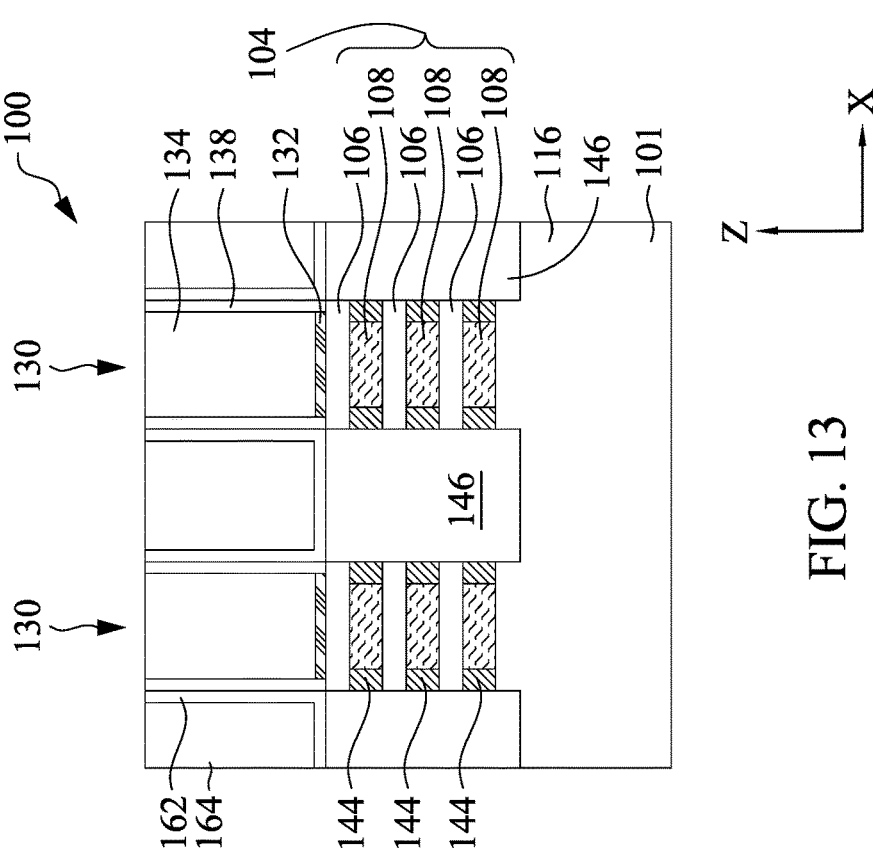

In FIG. 13, a planarization operation, such as CMP, is performed on the semiconductor device structure 100 to remove portions of the first ILD layer 164, the CESL 162, and the mask layer 136 until the sacrificial gate electrode layer 134 is exposed.

Figure 14:
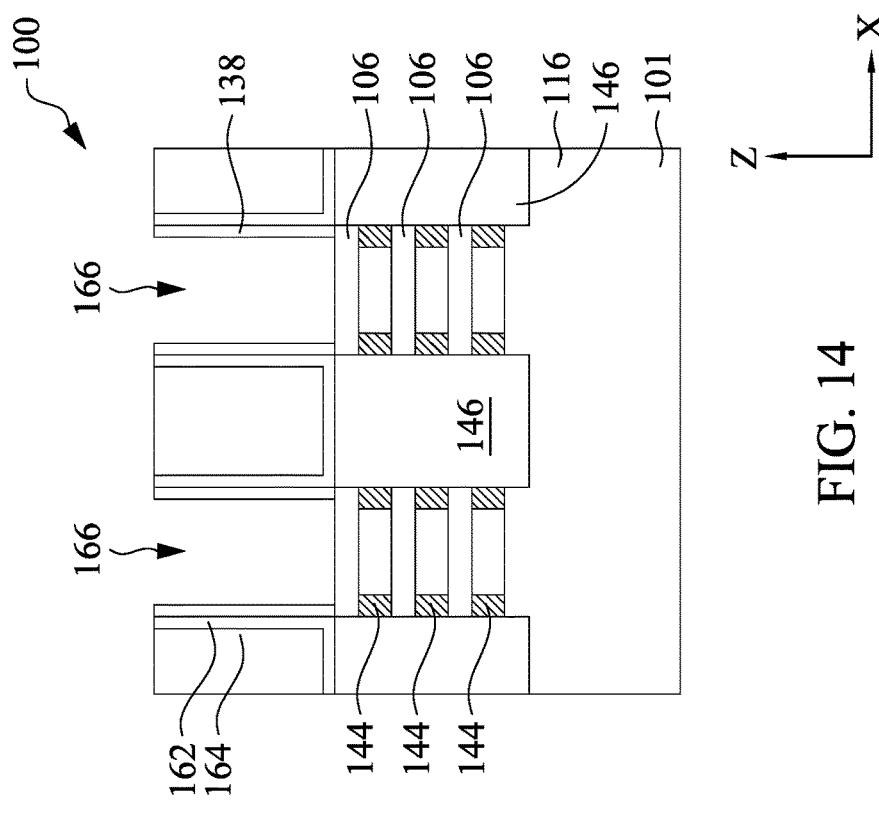

In FIG. 14, the sacrificial gate structure 130, the cladding layer 117, and the second semiconductor layers 108 are removed. The removal of the sacrificial gate structure 130 and the semiconductor layers 108 forms an opening 166 between gate spacers 138 and between adjacent first semiconductor layers 106. The first ILD layer 164 protects the S/D epitaxial features 146 during the removal processes. The sacrificial gate structure 130 can be removed using plasma dry etching and/or wet etching. The sacrificial gate electrode layer 134 may be first removed by any suitable process, such as dry etch, wet etch, or a combination thereof, followed by the removal of the sacrificial gate dielectric layer 132, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the gate spacers 138, the first ILD layer 164, and the CESL 162.

After the removal of the sacrificial gate structure 130, the cladding layers 117 are exposed. The removal of the cladding layers 117 and the second semiconductor layers 108 exposes the dielectric spacers 144 and the first semiconductor layers 106. The removal process may be any suitable etch processes, such as dry etch, wet etch, or a combination thereof. The etch process may be a selective etch process that removes the cladding layers 117 and the second semiconductor layers 108 but not the gate spacers 138, the first ILD layer 164, the CESL 162, the dielectric spacers 144, and the first semiconductor layers 106. As a result, a portion of the first semiconductor layers 106 not covered by the dielectric spacers 144 is exposed in the opening 166.

Figure 15:
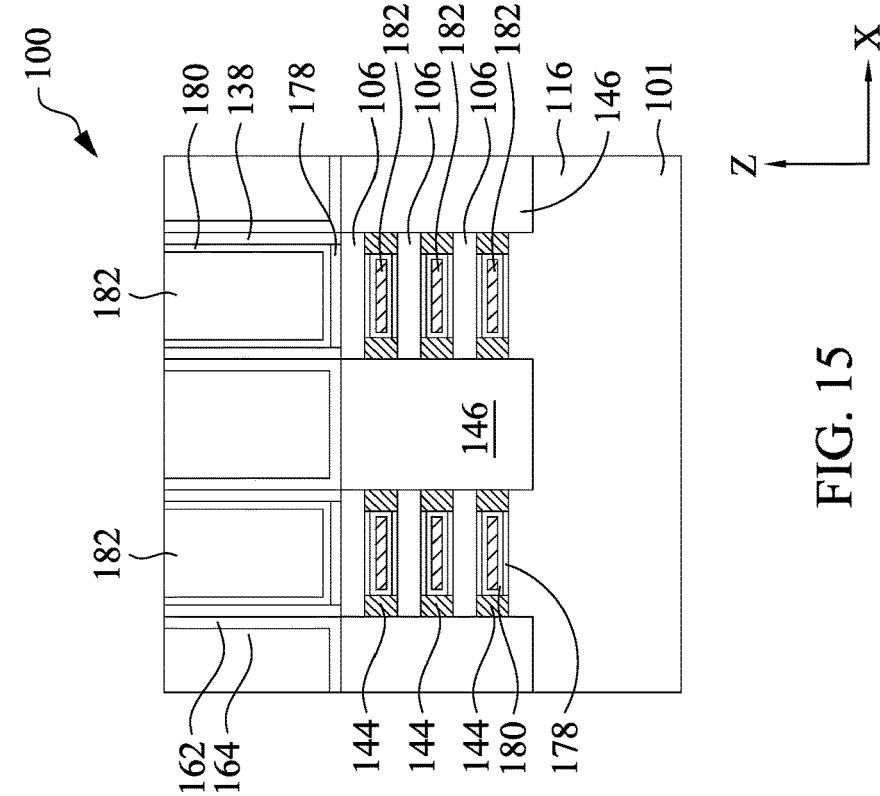

In FIG. 15, replacement gate structures 190 are formed. The replacement gate structures 190 each includes an interfacial layer (IL) 178, a gate dielectric layer 180, and a gate electrode layer 182. The interfacial layer (IL) 178 is formed to surround exposed surfaces of the first semiconductor layers 106 along the channel regions. The IL 178 may also form on the exposed surfaces of the substrate 101. The IL 178 may include or be made of an oxide (e.g., silicon oxide) formed by thermal or chemical oxidation of the first semiconductor layers 106, a nitride (e.g., silicon nitride, silicon oxynitride, oxynitride, etc.), and/or a dielectric layer (e.g., hafnium silicate). In one embodiment, the IL 178 is silicon oxide. The IL 178 may be formed by CVD, ALD, a clean process, or any suitable process.

Next, the gate dielectric layer 180 is formed on the exposed surfaces of the semiconductor device structure 100 (e.g., on the IL 178, sidewalls of the gate spacers 138, the top surfaces of the first ILD layer 164, the CESL 162, and the dielectric spacers 144). The gate dielectric layer 180 may include or made of a high-k dielectric material, such as hafnium oxide (HfO$_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide (Ta$_2$O$_5$), yttrium oxide (Y$_2$O$_3$), silicon oxynitride (SiON), or other suitable high-k materials. The gate dielectric layer 180 may be a conformal layer formed by a conformal process, such as an ALD process, a PECVD process, a molecular-beam deposition (MBD) process, or the like, or a combination thereof. The gate dielectric layer 180 may have a thickness in a range of about 0.3 nm to about 5 nm.

After formation of the IL 178 and the gate dielectric layer 180, the gate electrode layer 182 is formed on the gate dielectric layer 180. The gate electrode layer 182 fills the openings 166 (FIG. 14) and surrounds a portion of each of the first semiconductor layers 106. The gate electrode layer 182 includes one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The gate electrode layers 182 may be formed by PVD, CVD, ALD, electro-plating, or other suitable method. In some embodiments, one or more optional conformal layers (not shown) can be conformally (and sequentially, if more than one) deposited between the gate dielectric layer 180 and the gate electrode layer 182. The one or more optional conformal layers can include one or more barrier and/or capping layers and one or more work-function tuning layers. The one or more barrier and/or capping layers may include or be a nitride, silicon nitride, carbon nitride, and/or aluminum nitride of tantalum and/or titanium; a nitride, carbon nitride, and/or carbide of tungsten; the like; or a combination thereof. The one or more work-function tuning layers may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof.

Portions of the gate electrode layer 182, the one or more optional conformal layers (if any), and the gate dielectric layer 180 above the top surfaces of the first ILD layer 164, the CESL 162, and the gate spacers 138 may be removed by a planarization process, such as by a CMP process. After the CMP process, the top surfaces of the first ILD layer 164, the CESL 162, the gate spacers 138, and the gate electrode layer 182 are substantially co-planar.

Figure 16:
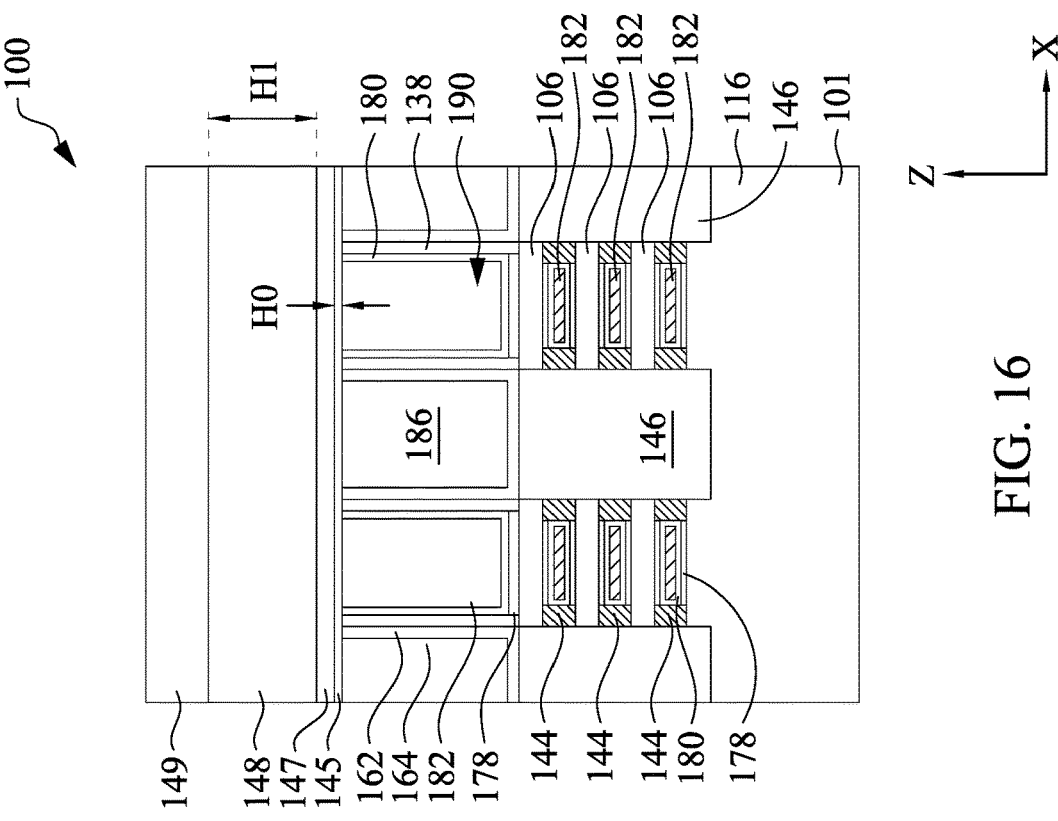
Figure 20:
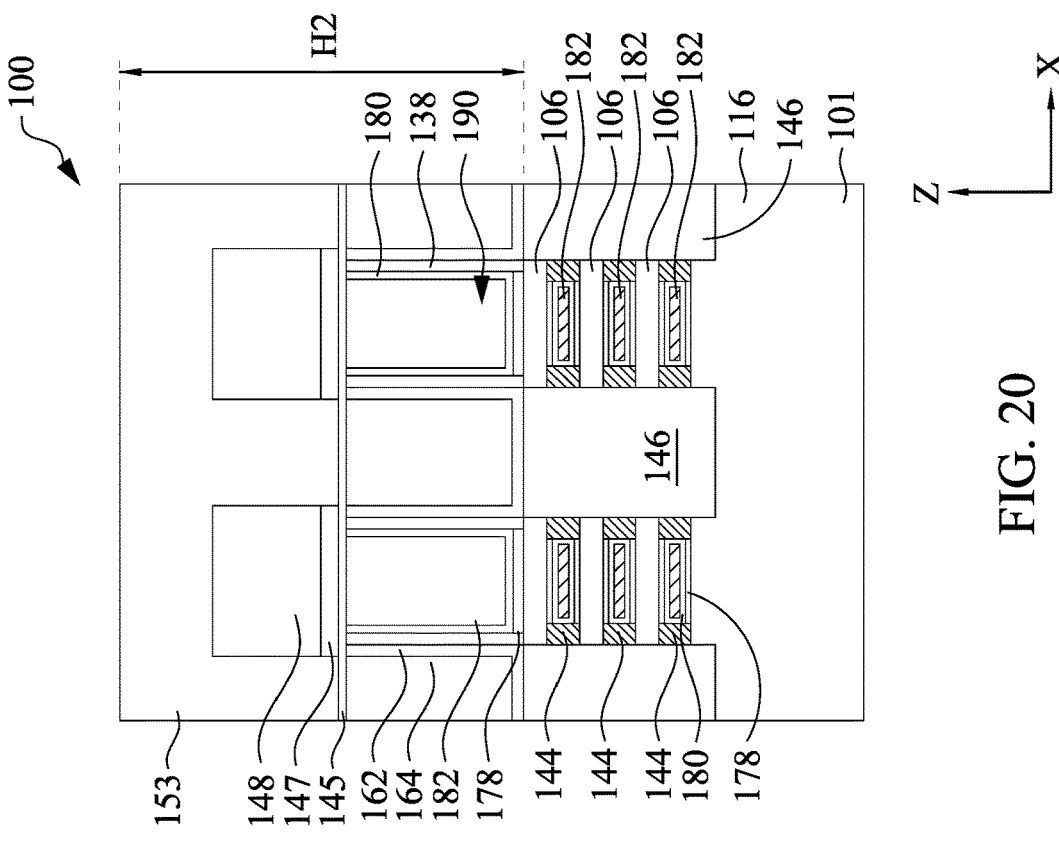

In FIG. 16, an etch stop layer 145, an oxide layer 147, a hard mask layer 148, and a resist layer 149 are sequentially formed on the replacement gate structure 190. The etch stop layer 145 is formed on the top surfaces of the first ILD layer 164, the CESL 162, the gate spacers 138, and the gate electrode layer 182. The oxide layer 147 is formed on the etch stop layer 145. The hard mask layer 148 is formed on the oxide layer 147. The resist layer 149 is formed on the nitride layer 148. The etch stop layer 145 and the hard mask layer 148 may include a nitrogen-containing material, such as silicon nitride, silicon carbon nitride, silicon oxycarbon nitride (SiOCN), carbon nitride, or the like, or a combination thereof, and may be formed by CVD, PECVD, ALD, or any suitable deposition technique. In some embodiments, the etch stop layer 145 is formed of a material different than that of the CESL 162. In some embodiments, the hard mask layer 148 may be formed of a dielectric material having an etch selectivity relative to the subsequent second ILD layer 153 (FIG. 20). Suitable dielectric material for the hard mask layer 148 may include, but is not limited to, SiO, HfSi, SiOC, AlO, ZrSi, AlON, ZrO, HfO, TiO, ZrAlO, ZnO, TaO, LaO, YO, TaCN, SiOCN, ZrN, or any combinations thereof. In some embodiments, the etch stop layer 145 and the hard mask layer 148 are silicon nitride. In some embodiments, the etch stop layer 145 is silicon oxycarbon nitride and the hard mask layer 148 is silicon nitride. Alternatively, the etch stop layer 145 and the hard mask layer 148 may include the same dielectric material but with different concentration ratio, composition, and/or oxidation rates (i.e., chemically different from each other). The etch stop layer 145 may have a thickness H0 in a range of about 1 nm to about 6 nm, for example about 3 nm. The hard mask layer 148 may have a thickness (or height) H1 of about 30 nm to about 60 nm, for example about 45 nm. In some embodiments, the thickness H0 and the thickness H1 have a ratio (H0:H1) in a range of about 1:6 to about 1:20, for example about 1:15. The oxide layer 147 may include a buried oxide (BOX) layer, a silicon oxide layer, or the like, and may be deposited by CVD, FCVD, or any suitable deposition technique. The oxide layer 147 may have a thickness of about 1 nm to about 6 nm, for example about 3 nm. The resist layer 149 may be a silicon-containing layer, such as an amorphous silicon, and may be deposited by PECVD or any suitable deposition technique. The resist layer 149 may have a thickness of about 20 nm to about 40 nm, for example about 30 nm.

Figure 17:
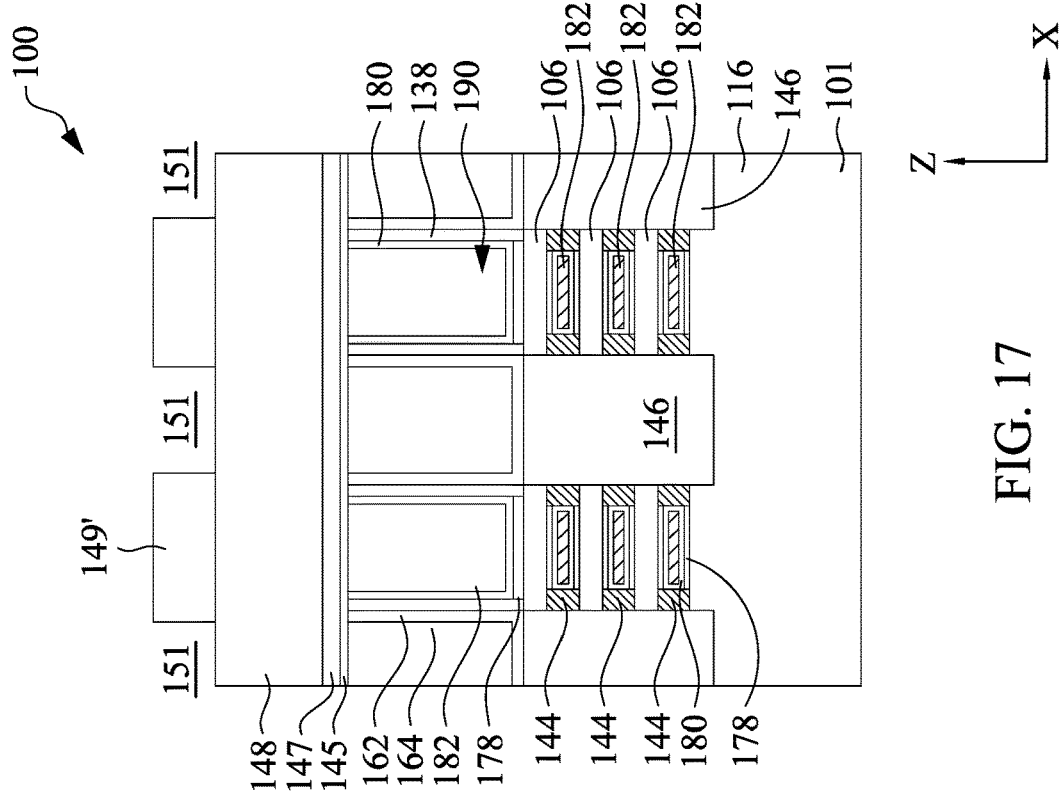

In FIG. 17, the resist layer 149 is patterned. The patterning of the resist layer 149 may include exposing the resist layer 149 to an exposure light/beam through a photo mask (not shown). The exposure light/beam can be deep ultraviolet (DUV) light, such as KrF excimer laser light and ArF excimer laser light, extreme ultraviolet (EUV) light having a wavelength around 13.5 nm, an X-ray, and/or electron beam. In some embodiments, multiple exposure processes are performed. After the exposure process, a developing process is performed to form the patterned resist layer 149'. As a result of the patterning process, openings 151 are formed in the resist layer 149, and portions of the hard mask layer 148 are exposed through the openings 151.

Figure 18:
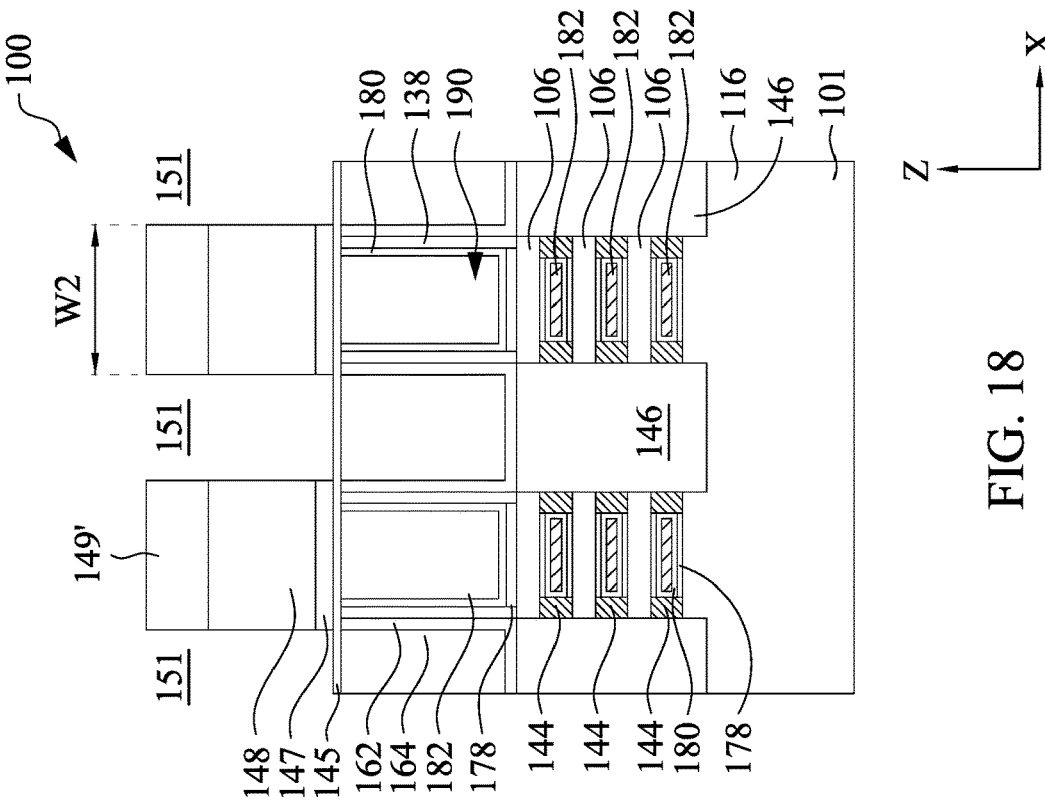

In FIG. 18, the pattern of the resist layer 149' is transferred to the hard mask layer 148 and the oxide layer 147, using the patterned resist layer 149' as a mask, by removing portions of the hard mask layer 148 and the oxide layer 147. As a result, the openings 151 are extended through the hard mask layer 148 and the oxide layer 147 to expose the top surface of the etch stop layer 145. The removal of the portions of the hard mask layer 148 and the oxide layer 145 may be performed using one or more etch processes, such as a dry etch, a wet etch, or a combination thereof. The etchants selectively remove the hard mask layer 148 and the oxide layer 147 but do not substantially remove the etch stop layer 145. The remaining hard mask layer 148 may have a width W2 in a range of about 15 nm to about 40 nm, for example about 20 nm to about 35 nm.

Figure 19:
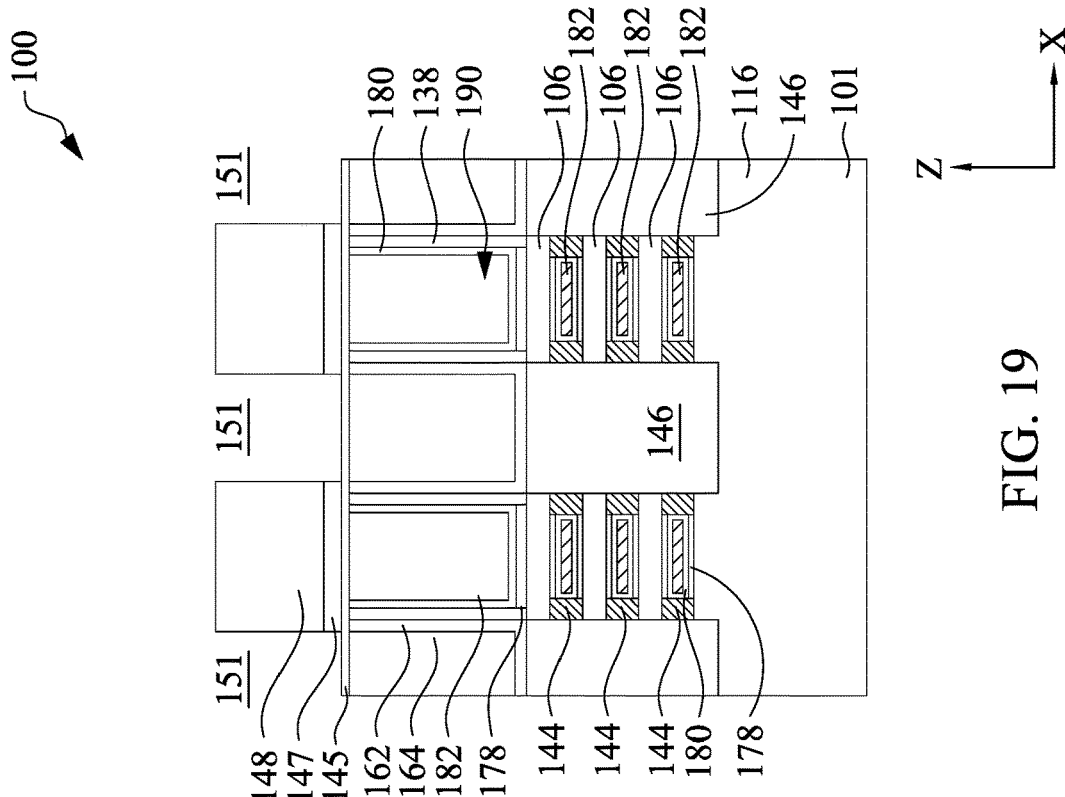

In FIG. 19, the patterned resist layer 149' is removed. The removal of the patterned resist layer 149' may be done by any suitable etch process, such as a dry etch, a wet etch, or a combination thereof. In one embodiment, the etch process is a plasma etch process using a fluorine-based chemistry. After the removal process, an optional cleaning process is performed. The cleaning process may be any suitable wet cleaning process including, for example, hydrofluoric acid (HF), standard clean 1 (SC1), and ozonated deionized water (DIO$_3$). In one embodiment, the cleaning process is performed by exposing the semiconductor device structure 100 to HF (1:500 dilution), followed by the DIO$_3$ rinsing and SC1 cleaning, which is a mixture of deionized (DI) water, ammonia hydroxide (NH+OH), and hydrogen peroxide (H$_2$O$_2$). Other cleaning process, such as an APM process, which includes at least water (H$_2$O), NH$_4$OH, and H$_2$O$_2$, a HPM process, which includes at least H$_2$O, H$_2$O$_2$, and hydrogen chloride (HCl), a SPM process (also known as piranha clean), which includes at least H$_2$O$_2$ and sulfuric acid (H$_2$SO$_4$), or any combination thereof, may also be used.

In FIG. 20, a second ILD layer 153 is formed on the semiconductor device structure 100. The second ILD layer 153 covers the exposed surfaces of the hard mask layer 148, the oxide layer 147, and the etch stop layer 145. The second ILD layer 153 may be deposited to a height over the top surface of the hard mask layer 148. The second ILD layer 153 may include the same material as the first ILD layer 164. The second ILD layer 153, the etch stop layer 153, the first ILD layer 164, and the CESL 162 have a combined height H2 of about 60 nm to about 120 nm, for example about 80 nm.

Figure 21:
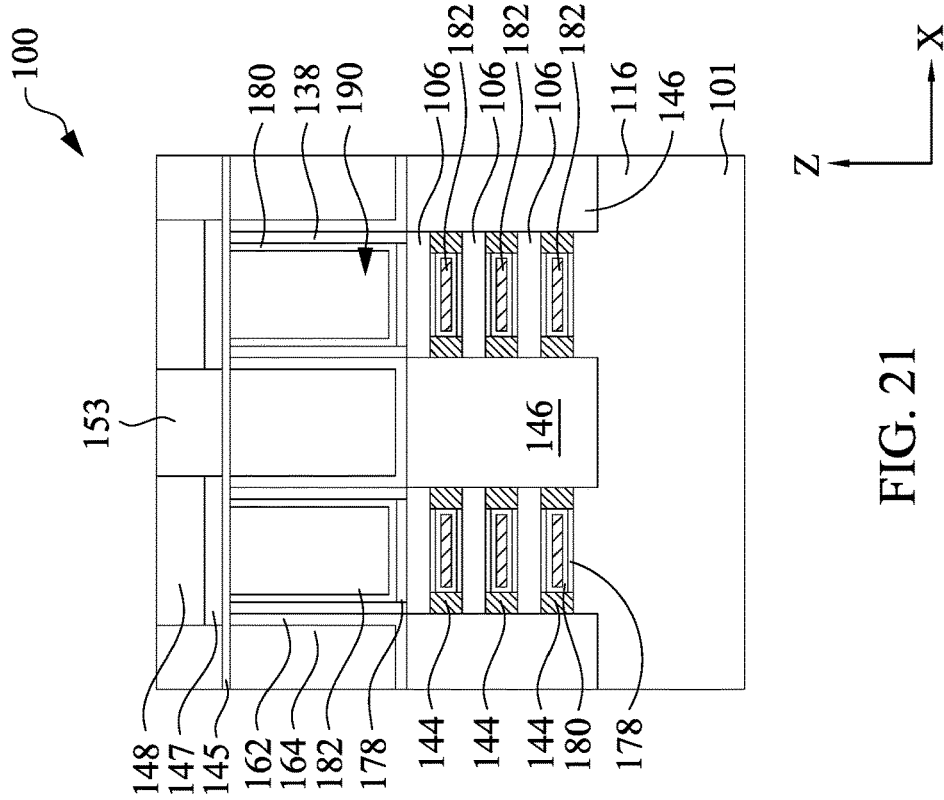

In FIG. 21, a planarization process, such as a CMP process, is performed on the semiconductor device structure 100. The CMP process may be performed until the hard mask layer 148 is exposed. In some embodiments, the CMP process is performed until the combined height of the second ILD layer 153, the etch stop layer 145, the first ILD layer 164, and the CESL 162 is reduced from H2 (FIG. 20) to H3, which is in a range of about 20 nm to about 40 nm, for example about 30 nm. The remaining hard mask layer 148 and the oxide layer 147 serve as gate capping layer for the underlying gate electrode layer 182.

Figure 22:
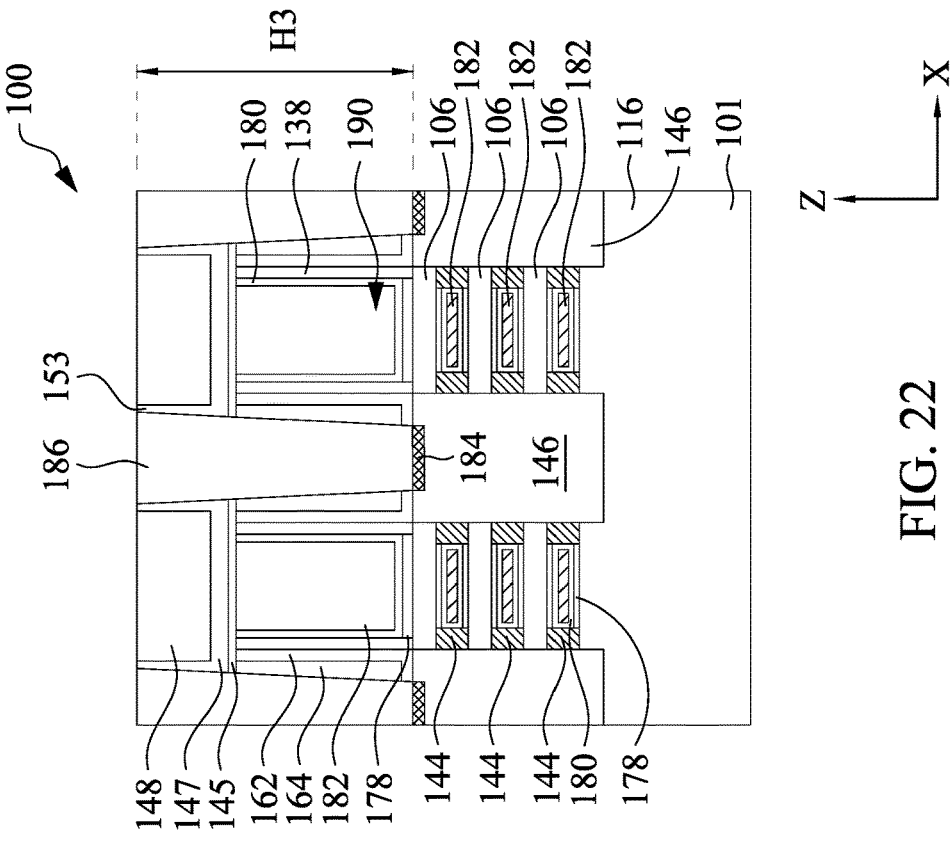

In FIG. 22, contact openings are formed through the second ILD layer 153, the etch stop layer 145, the first ILD layer 164, and the CESL 162 to expose the epitaxial S/D feature 146. A silicide layer 184 is then formed on the S/D epitaxial features 146, and a source/drain (S/D) contact 186 is formed in the contact opening on the silicide layer 184. The S/D contact 186 may include an electrically conductive material, such as Ru, Mo, Co, Ni. W, Ti, Ta, Cu, Al, TiN, or TaN. While not shown, a barrier layer (e.g., TiN, TaN, or the like) may be formed on sidewalls of the contact openings prior to forming the S/D contacts 186. The S/D contact 186 may have a height H3 in a range of about 25 nm to about 40 nm, for example about 30 nm.

Figure 23:
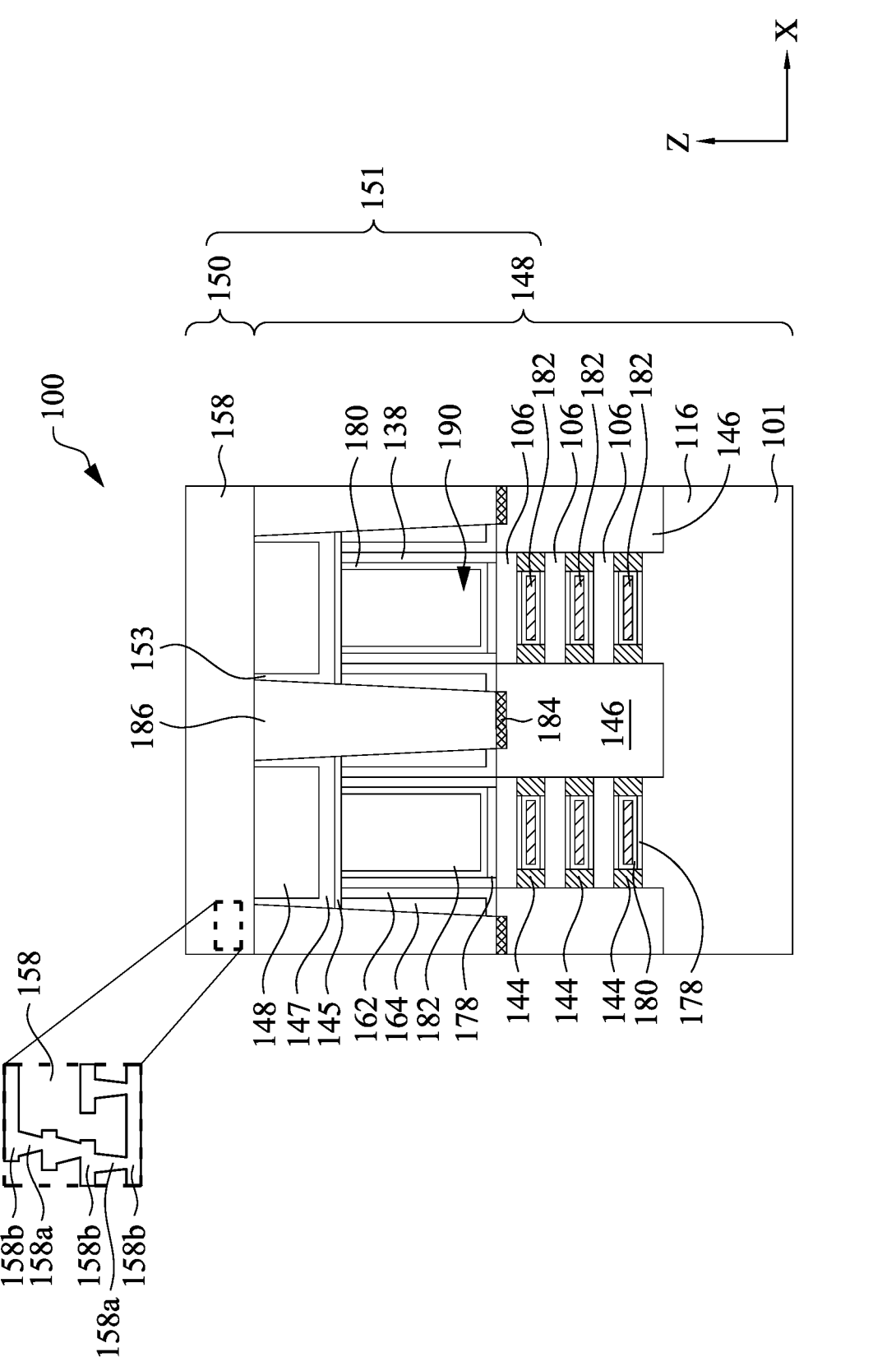

In FIG. 23, an interconnect structure layer 150 is formed over the semiconductor device structure 100. For ease of illustration purpose, the layer structure of the semiconductor device structure 100 is referred to herein as a transistor structure layer 148. The transistor structure layer 148 and the interconnect structure layer 150 can be referred to as a device wafer 151. The interconnect structure layer 150 can include a back-end-of-line (BEOL) interconnect structure formed on the front side of the semiconductor device structure 100. The interconnect structure layer 150 may include a plurality of dielectric layers 158 and a plurality of vertical interconnect features, such as vias 158a, and horizontal interconnect features, such as metal lines 158b, embedded in dielectric layers 158. A dielectric layer (e.g., dielectric layer 158) having metal lines or vias can be referred to as a metal layer. In some cases, the interconnect structure layer 150 may include 8 metal layers or more, such as 10 metal layers or more, depending on the application.

One or more metal lines 158b in the dielectric layer 158 may be aligned and/or in contact with the source/drain contacts 186, and one or more metal lines 158b in the dielectric layer 158 may be aligned and in contact with metal gate contact via (not shown) contacting the gate electrode layer 182, thereby providing electrical connection between the metal lines 158a-b and the replacement gate stack 190. In some embodiments, the metal lines 158b and vias 158a are configured such that elements of the transistors (e.g., epitaxy S/D features 146 at the drain region and the gate electrode layer 182 of the replacement gate stack 190) are electrically connected with solder balls or bonding pads that may be found in a back-end packaging structure (not shown) through various metal lines 158b and vias 158a in the dielectric layer 158.

Figure 24:
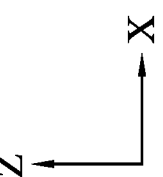
Figure 24:
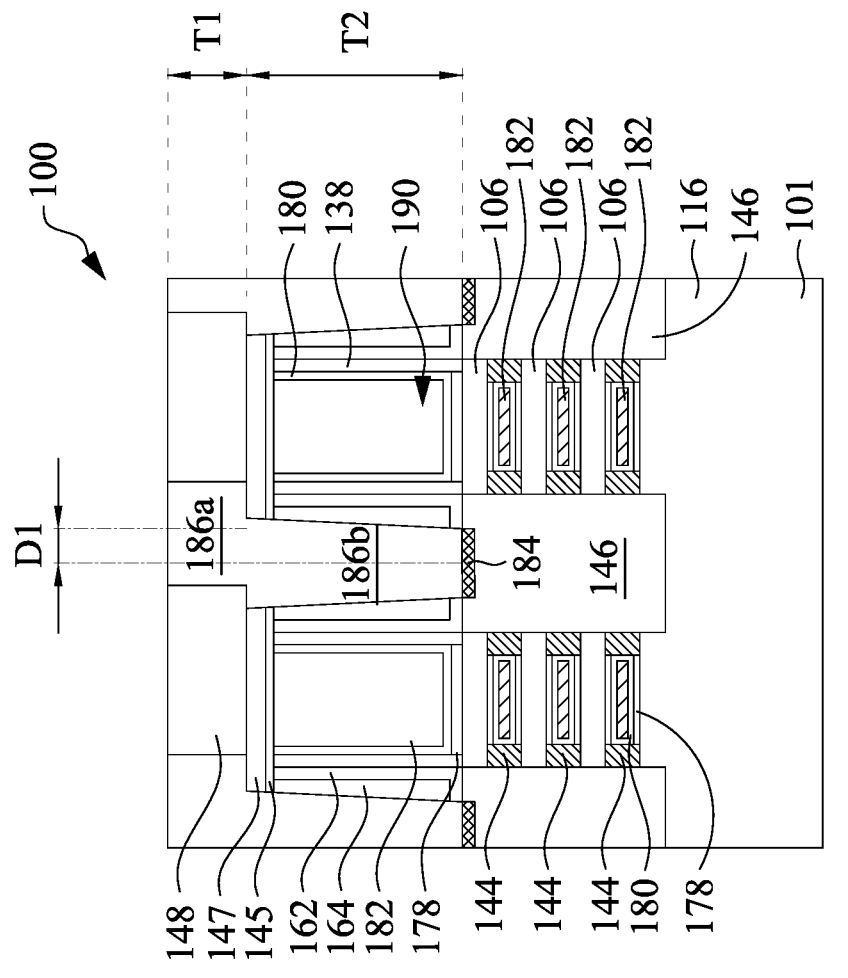

In most embodiments, the contact openings 151 (FIG. 17) are aligned with the epitaxial source/drain features 146 and/or the first ILD layer 164 disposed between two adjacent replacement gate structures 190. In some embodiments, however, the contact opening 151 may be misaligned with the portion of the epitaxial source/drain features 146 and/or the first ILD layer 164 between two adjacent replacement gate structures 190 due to overlay shift, and the oxide layer 147 may be exposed. As a result, subsequently formed S/D contact 186a in the hard mask layer 148 may be partially shifted by an offset D1 from the S/D contact 186b extending through the oxide layer 147, the etch stop layer 145, the first ILD layer 164, and the CESL 162. FIG. 24 illustrates an upper portion 186a of the S/D contacts 186 is slightly offset to the right from a lower portion 186b of the S/D contacts 186, according to an alternative embodiment of the present disclosure. In some embodiments, the upper portion 186a of the S/D contacts 186 may have a cylindrical profile and the lower portion 186b of the S/D contacts 186 may have a cone-shaped or tapering profile. In some embodiments, the upper portion 186a of the S/D contacts 186 may have a thickness T1 and the lower portion 186b of the S/D contacts 186 may have a thickness T2 that is equal to or greater than the thickness T1. In some embodiments, the thickness T2 is greater than the thickness T1 and the ratio of (T1:T2) is about 1:1.5 to about 1:3, for example about 1:2. In some embodiments, a central line extending through the upper portion 186a of the S/D contact 186 is shifted by an offset D1 from a central line extending through the lower portion 186b of the S/D contact 186. In one embodiment, the offset D1 is in a range of about 1 nm to about 6 nm, for example about 2 nm to about 3 nm. In some embodiments, a portion of the upper portion 186a of the S/D contact 186 is in contact with a top surface of the oxide layer 147.

In traditional semiconductor manufacturing process, a self-aligned contact (SAC) structure is often placed on the gate by removing a portion of the gate electrode layer and replacing it with an insulator that is compositionally different from the S/D contact dielectric. The SAC structure prevents contact-to-gate shorts that may occur due to misalignment and partial overlaps of the contacts over the gate. Instead of removing the gate material, the inventive hard mask layer 148, the oxide layer 147, and the etch stop layer 145 as shown in either embodiment of FIG. 23 or 24 is a protective structure functioning like a self-aligned contact (SAC) for the replacement gate structures 190, and is formed by a direct contact patterning process. With this approach, the contact-to-gate shorts is minimized or avoided since the gate (e.g., gate electrode layer 182) is physically separated from the S/D contact 186 by the hard mask layer 148, the oxide layer 147, the etch stop layer 145, the second ILD layer 153, the first ILD layer 164, the CESL 162, and the gate spacer 138. Particularly, this approach does not require recessing the gate electrode layer 182, which may result in residues of the gate material being left at the periphery of the SAC structure and create a short between the contact and the gate. The SAC structure formed in accordance with various embodiments of the present disclosure enable aggressive scaling of the contact poly pitch while minimizing yield loss due to contact landing misalignment.

FIGS. 25-32 are cross-sectional side views of various stages of manufacturing the semiconductor device structure 100 taken along cross-section A-A of FIG. 8, in accordance with some alternative embodiments. The embodiments of FIGS. 25-31 may be used in certain areas of a wafer and may be co-exist with the embodiments of FIGS. 16-24 on the same wafer. The semiconductor device structure 100 of FIGS. 25-31 is similar to the embodiment of FIG. 23 except that the hard mask layer 248 is formed with a reduced thickness (or height) when compared to the thickness H3 of the hard mask layer 148 (FIG. 16). It should be noted that the same reference numerals are used in FIGS. 25-31 to refer to identical elements shown in FIGS. 16-24, and thus some of the processes will not be discussed for the sake of brevity.

Figure 25:
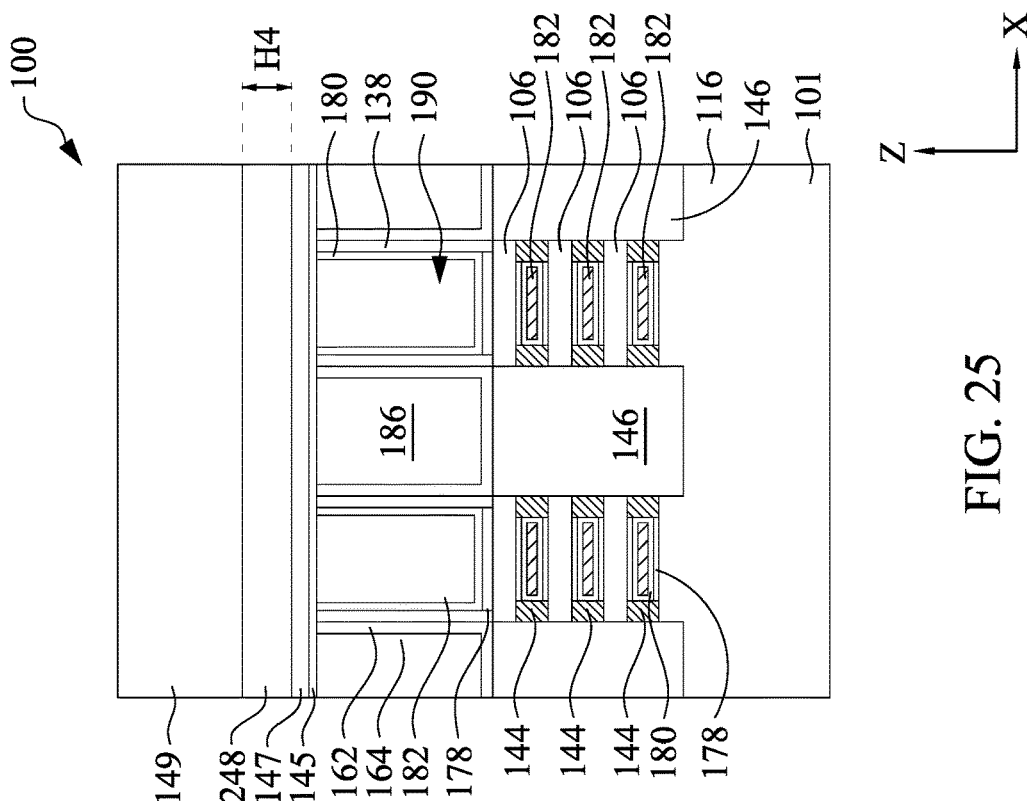

In FIG. 25, an etch stop layer 145, an oxide layer 147, a hard mask layer 248, and a resist layer 149 are sequentially formed on the replacement gate structure 190. The etch stop layer 145, the oxide layer 147, the hard mask layer 248, and the resist layer 149 are sequentially formed over the replacement gate structures 190, as discussed above with respect to FIG. 16. In this embodiment, the hard mask layer 248 has a thickness (or height) H4 in a range of about 15 nm to about 30 nm, for example about 18 nm to about 20 nm.

Figure 26:
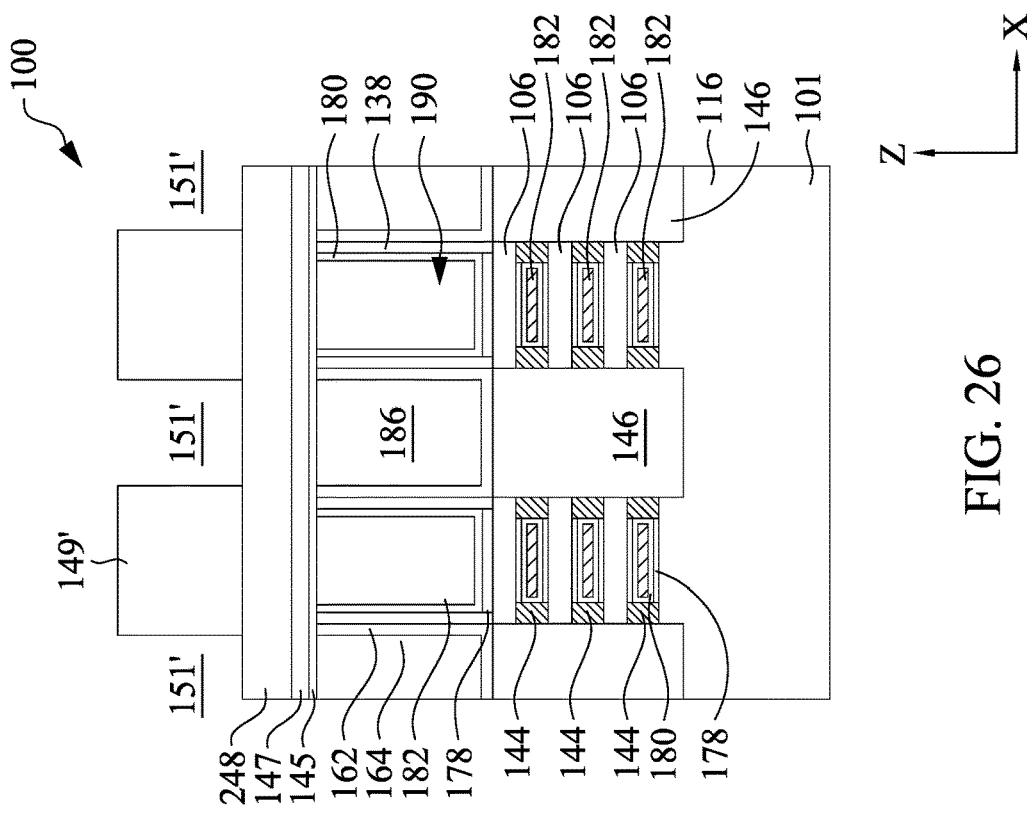

In FIG. 26, patterned resist layer 149' is formed with openings 151' exposing the top surfaces of the hard mask layer 248. In cases where certain areas of the semiconductor device structure 100 of a wafer is patterned, the patterned resist layer 149' may be formed by exposing to an extreme ultraviolet (EUV) light for enhanced patterning capability and process simplicity when compared to multiple patterning processes.

Figure 27:
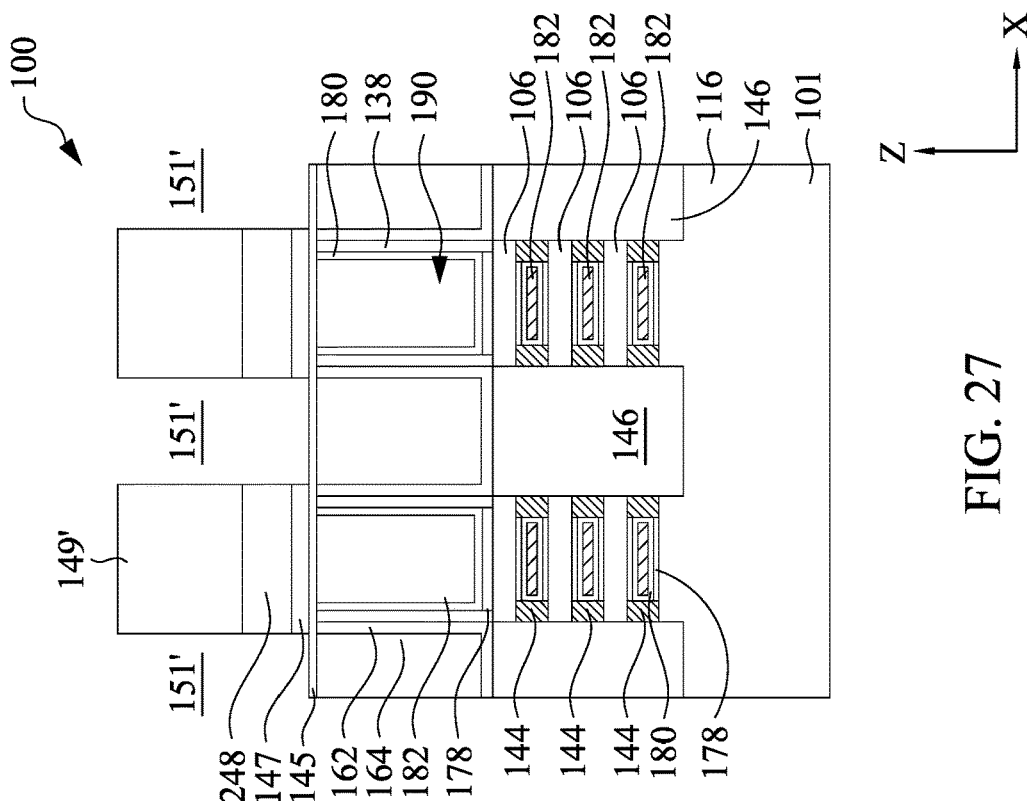

In FIG. 27, the pattern of the resist layer 149' is transferred to the hard mask layer 248 and the oxide layer 147, using patterned resist layer 149' as a mask.

Figure 28:
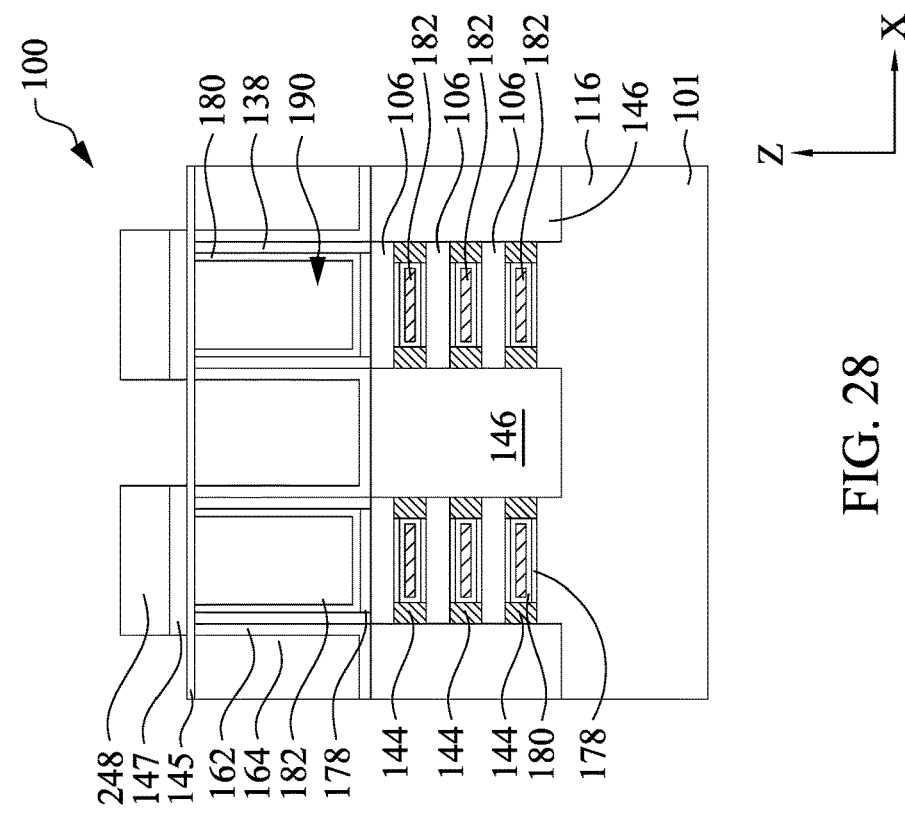

In FIG. 28, the patterned resist layer 149' is removed, and an optional cleaning process may be performed.

Figure 29:
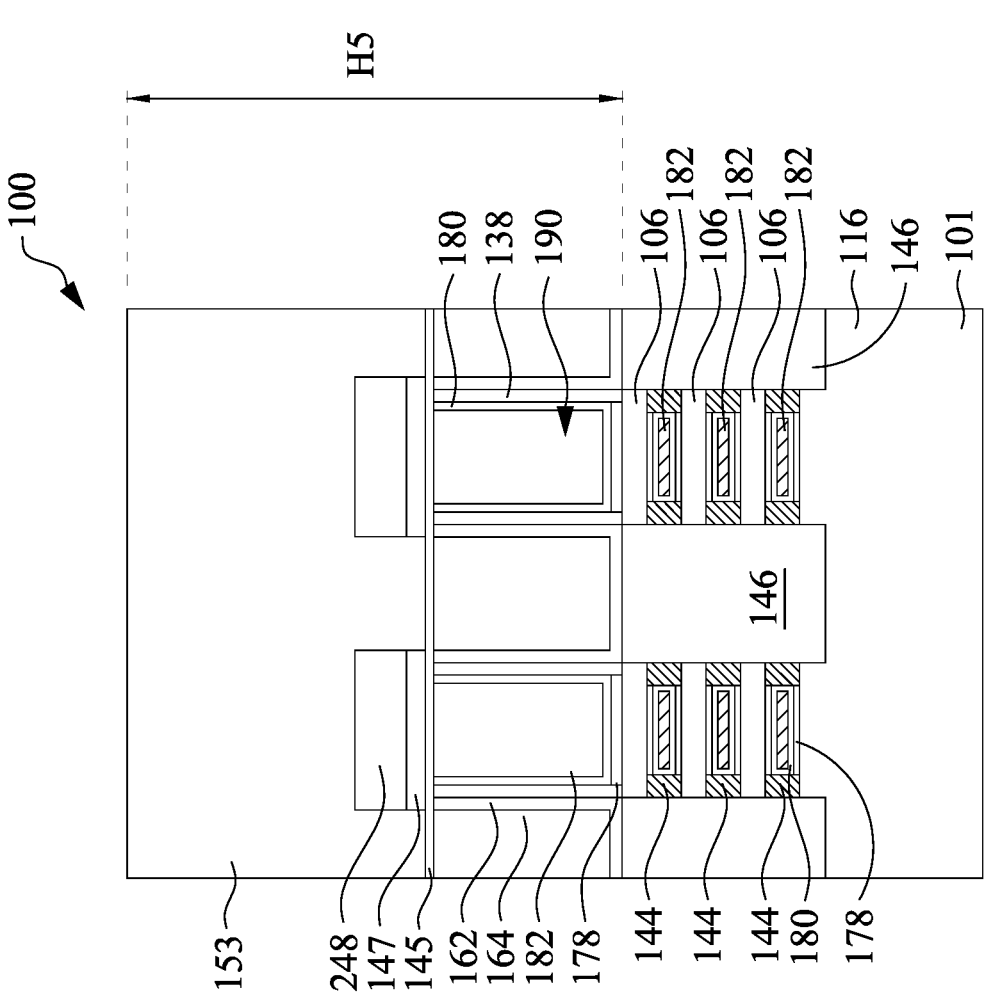

In FIG. 29, a second ILD layer 153 is formed to cover the exposed surfaces of the hard mask layer 248, the oxide layer 147, and the etch stop layer 145. The second ILD layer 153 may be deposited to a height over the top surface of the hard mask layer 248. The second ILD layer 153, the etch stop layer 145, the first ILD layer 164, and the CESL 162 may have a combined height H5 of about 60 nm to about 120 nm, for example about 90 nm.

Figure 30:
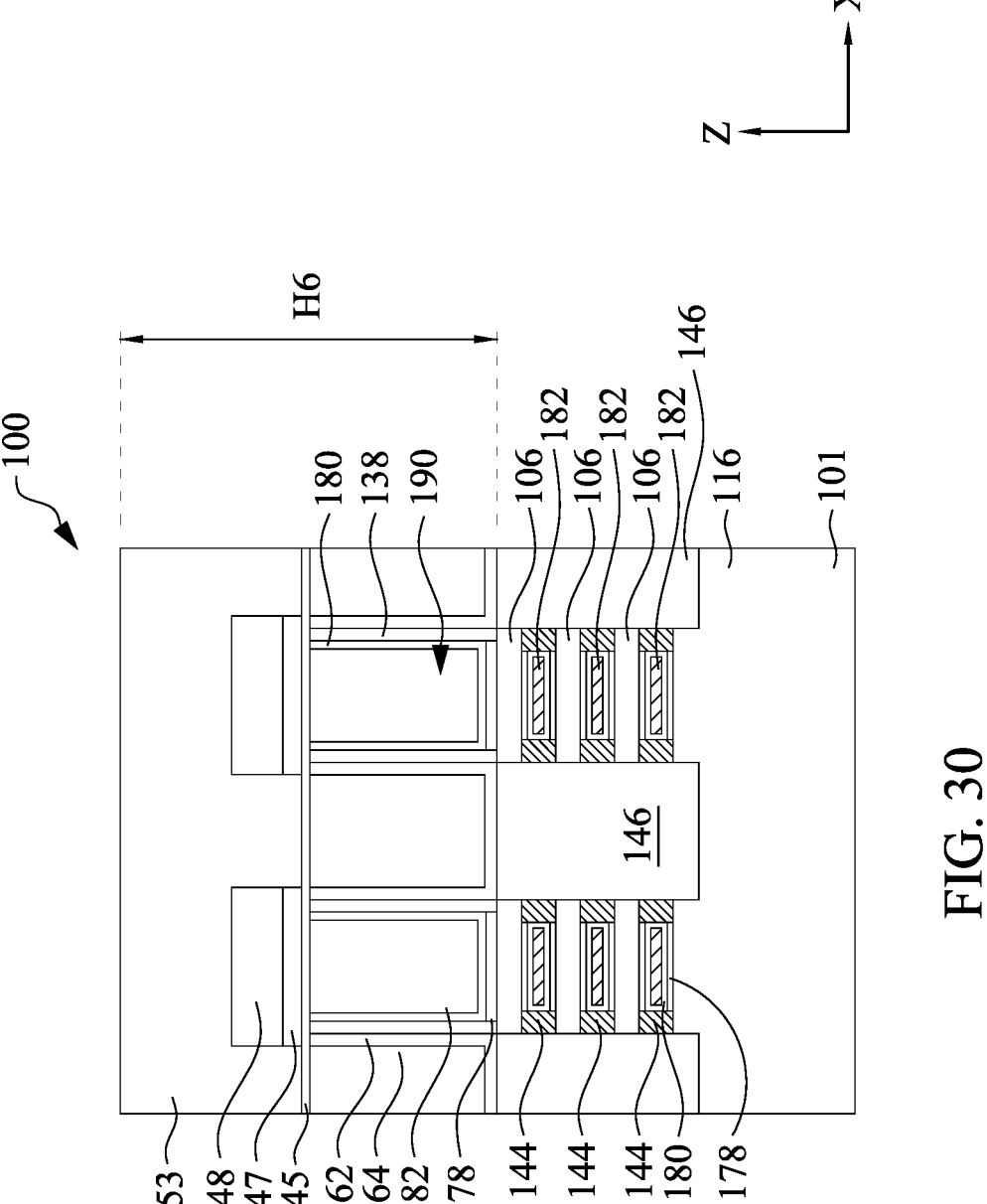

In FIG. 30, a planarization process is performed on the semiconductor device structure 100. The CMP process may be performed until the combined thickness (or height) of the second ILD layer 153, the etch stop layer 145, the first ILD layer 164, and the CESL 162 is reduced from H5 (FIG. 29) to H6, which is in a range of about 50 nm to about 110 nm, for example about 75 nm. The remaining hard mask layer 248 and the oxide layer 147 serve as gate capping layer for the underlying gate electrode layer 182.

Figure 31:
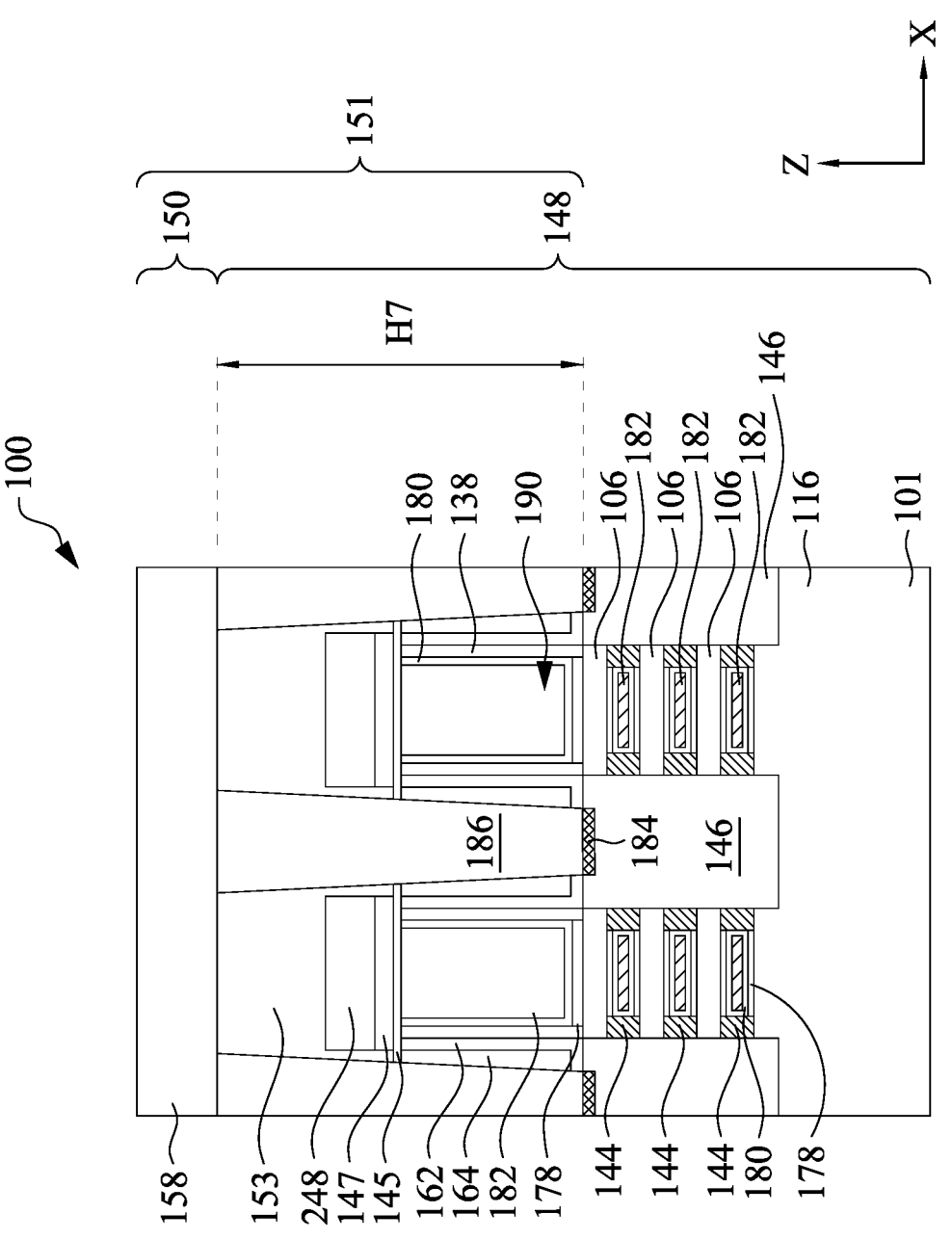

In FIG. 31, contact openings are formed through the second ILD layer 153, the etch stop layer 145, the first ILD layer 164, and the CESL 162 to expose the epitaxial S/D feature 146. A silicide layer 184 is then formed on the S/D epitaxial features 146, and a source/drain (S/D) contact 186 is formed in the contact opening on the silicide layer 184. The S/D contact 186 may have a height H7 in a range of about 25 nm to about 40 nm, for example about 30 nm. Thereafter, an interconnect structure layer 150 is formed over the semiconductor device structure 100.

Figure 32:
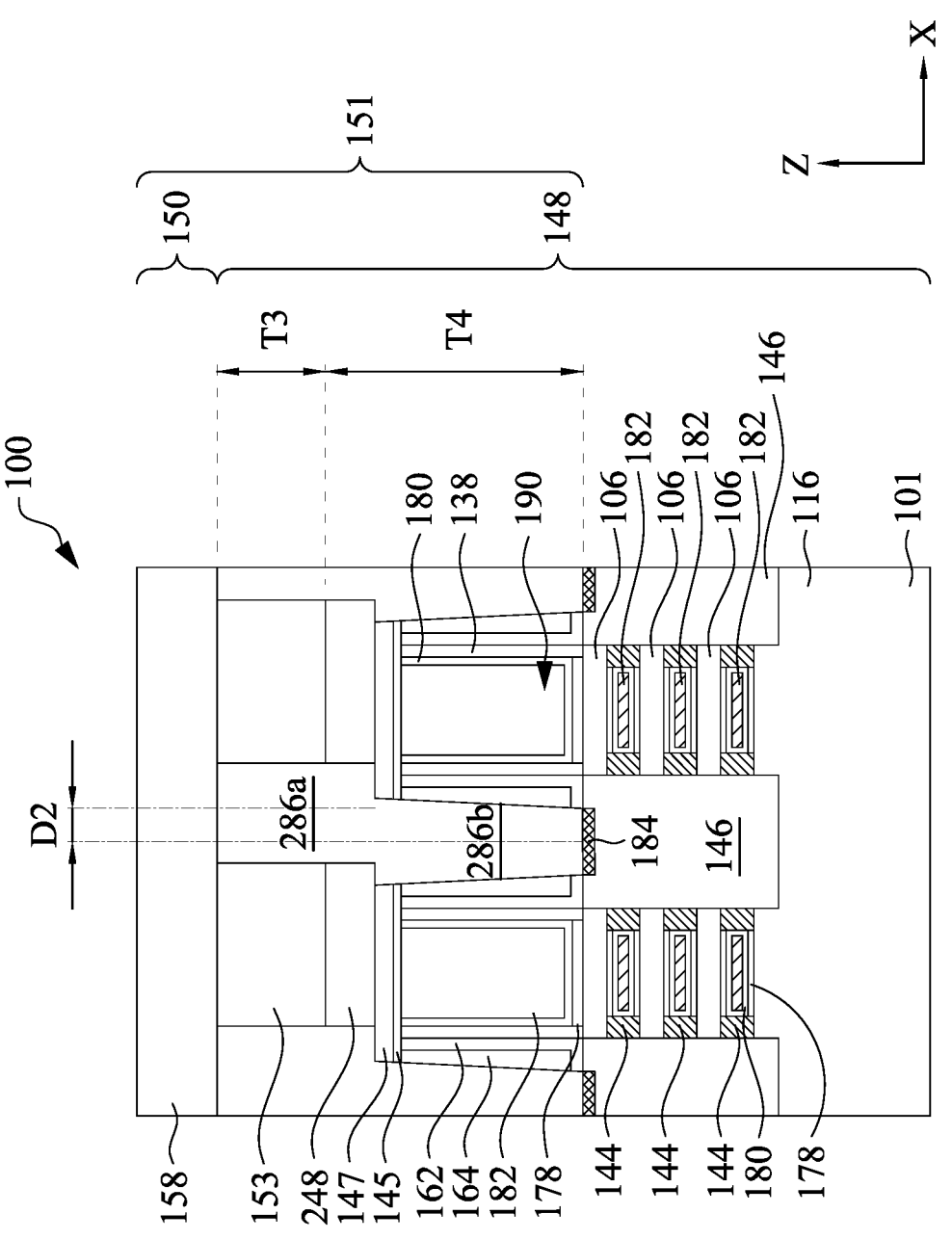

Likewise, in most embodiments the contact openings 151' (FIG. 26) are aligned with the epitaxial source/drain features 146 and/or the first ILD layer 164 disposed between two adjacent replacement gate structures 190. In some embodiments, however, the contact opening 151' may be misaligned with the portion of the epitaxial source/drain features 146 and/or the first ILD layer 164 between two adjacent replacement gate structures 190 due to overlay shift, and the oxide layer 147 may be exposed. As a result, subsequently formed S/D contact 286 in the hard mask layer 248 may be partially shifted by an offset D2 from the S/D contact 286 extending through the oxide layer 147, the etch stop layer 145, the first ILD layer 164, and the CESL 162. FIG. 32 illustrates an upper portion of the S/D contacts 286a is slightly offset to the right from a lower portion 286b of the S/D contacts 286, according to an alternative embodiment of the present disclosure. In some embodiments, the upper portion 286a of the S/D contacts 286 may have a cylindrical profile and the lower portion 286b of the S/D contacts 286 may have a cone-shaped or tapering profile. In some embodiments, the upper portion 286a of the S/D contacts 286 may have a thickness T3 and the lower portion 286b of the S/D contacts 286 may have a thickness T4 that is equal to or greater than the thickness T1. In some embodiments, the thickness T2 is greater than the thickness T1 and the ratio of (T1:T2) is about 1:1.5 to about 1:3, for example about 1:2. In some embodiments, a central line extending through the upper portion 286a of the S/D contact 286 is shifted by an offset D2 from the lower portion 286b of the S/D contact 186, and the offset D2 is in a range of about 1 nm to about 6 nm, for example about 2 nm to about 3 nm.

FIGS. 33-37 are cross-sectional side views of various stages of manufacturing the semiconductor device structure 200 taken along cross-section A-A of FIG. 8, in accordance with some alternative embodiments. It should be noted that the same reference numerals are used in FIGS. 33-37 to refer to identical elements shown in FIGS. 25-32, and thus some of the processes will not be discussed for the sake of brevity.

Figure 33:
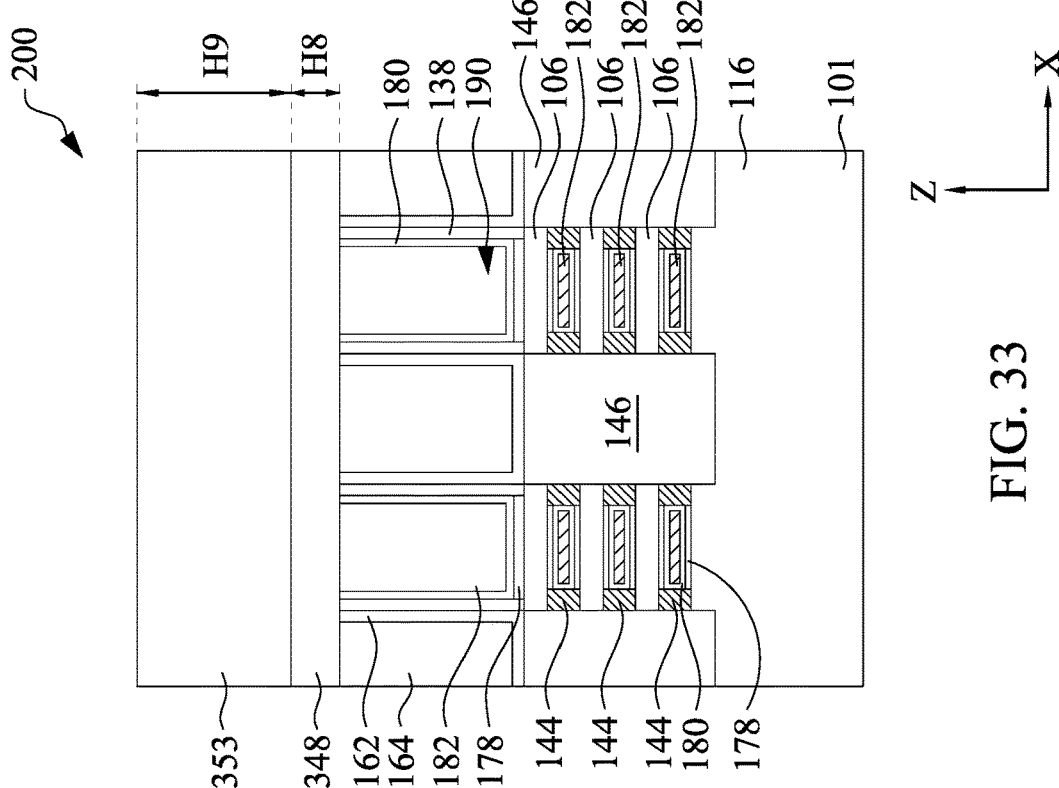

In FIG. 33, after the replacement gate structures 190 are formed, a hard mask layer 348 and a second ILD layer 353 are sequentially formed on the semiconductor device structure 200. The hard mask layer 348 and the second ILD layer 353 may include the same material as the hard mask layer 248 and the second ILD layer 153, as discussed above with respect to FIGS. 25 and 29. In some embodiments, the hard mask layer 348 may have a height (or height) H8 in a range of about 2 nm to about 10 nm, for example about 5 nm, and the second ILD layer 353 may have a height (or height) H9 in a range of about 50 nm to about 90 nm, for example about 70 nm.

Figure 34:
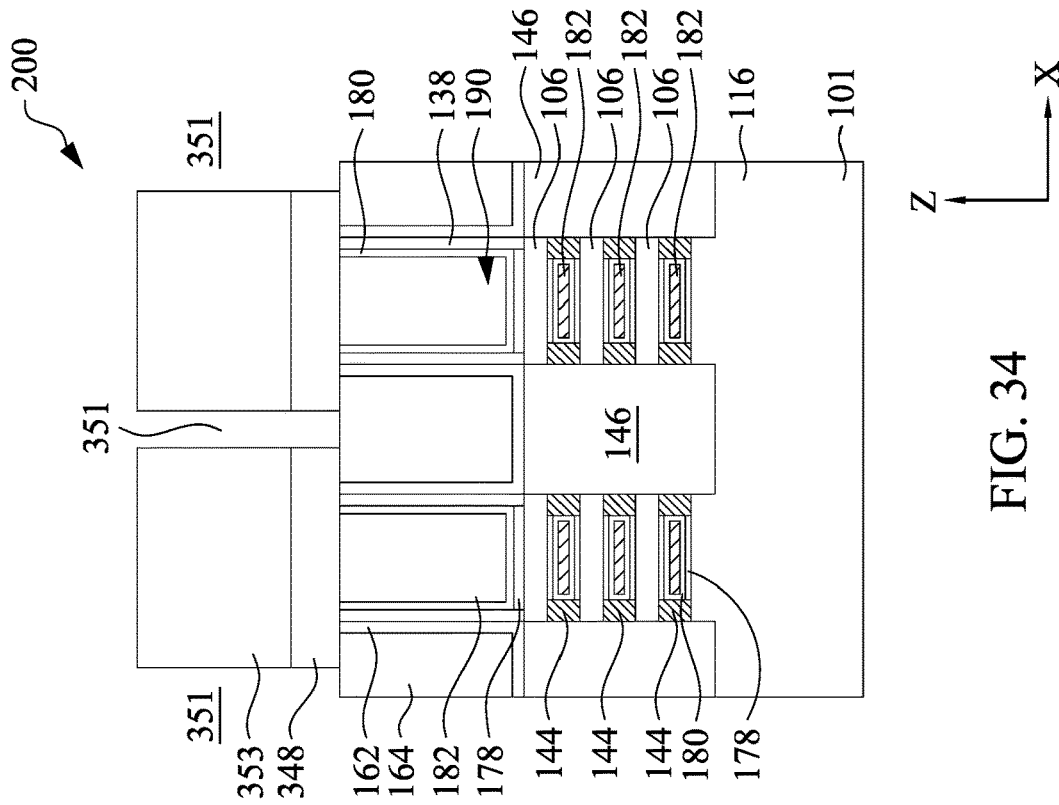

In FIG. 34, portions of the second ILD layer 353 and the hard mask layer 348 are removed. A resist layer (not shown) may be first formed on the second ILD layer 353, followed by patterning and etching processes to remove portions of the resist layer at selected regions (e.g., regions between two adjacent replacement gate structures 190) to form the patterned resist layer. The second ILD layer 353 and the hard mask layer 348 are then etched by one or more etch processes using the patterned resist layer as a mask. The one or more etch processes form openings 351 through the second ILD layer 353 and the hard mask layer 348.

Figure 35:
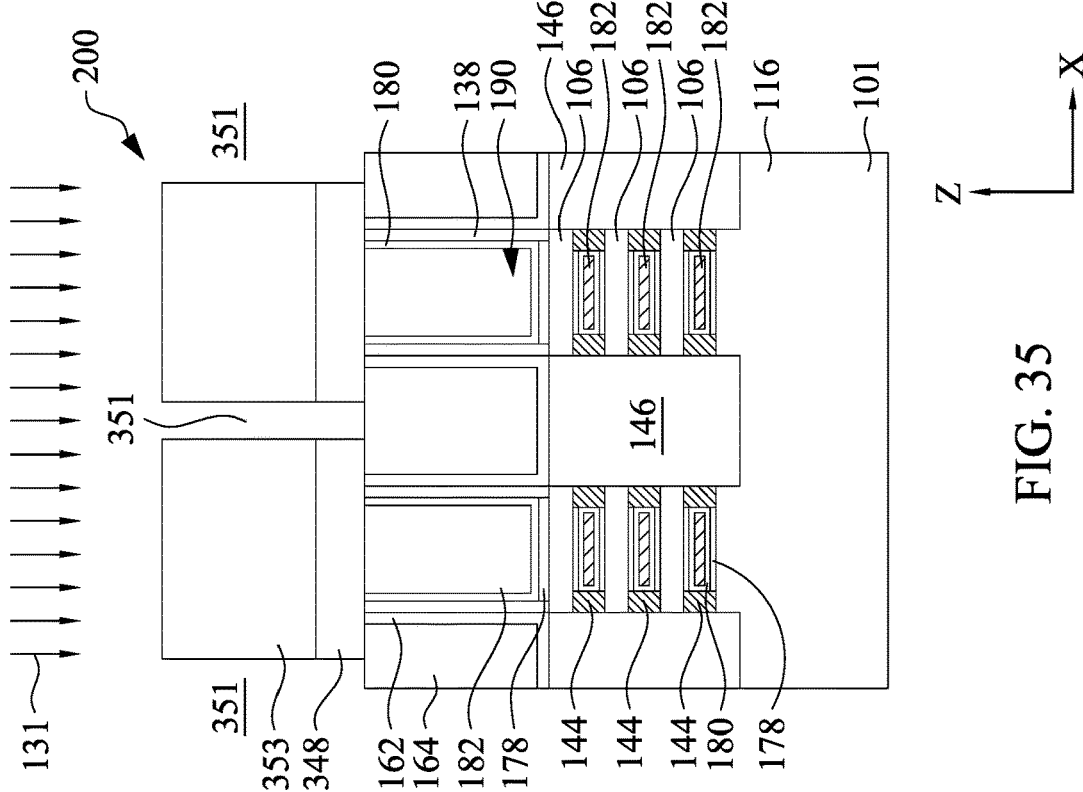

In FIG. 35, the exposed surfaces of the second ILD layer 353 and the hard mask layer 348 are subjected to a treatment process 131. The treatment process 131 enhances the etch selectivity between the second ILD layer 353 and the hard mask layer 348. In addition, since the exposed surfaces of the first ILD layers 164 are moderately treated as compared to the second ILD layer 353 and the hard mask layer 348, the etch selectivity between the first ILD layer 164 and the hard mask layer 348 as well as the second ILD layer 353 are further enhanced. The treatment process 131 thus allows the second ILD layer 353 and the first ILD layer 164 to be etched at a faster rate than the hard mask layer 348. In some embodiments, the treatment process 131 is a material modification process through which the material of the second ILD layer 353 and the hard mask layer 348 is chemically altered. In some embodiments, the treatment process 131 is a plasma treatment process in which the semiconductor device structure 200 is exposed to a nitrogen-based plasma. The entire body of the treated second ILD layer 353 and the hard mask layer 348 may have nitrogen as a result of the treatment process 131. The nitrogen-based plasma may be generated by a decoupled plasma nitridation process, a remote plasma nitridation process, or a combination thereof. The treatment process 131 may be performed by exposing the exposed surfaces of the second ILD layer 353 and the hard mask layer 348 to a nitrogen plasma at a chamber pressure of about 0.1 Torr to about 10 Torr for about 1 second to about 60 seconds, with an RF power in a range of about 200 W to about 500 W using a tunable frequency ranging from about 2 MHz to about 13.56 MHz.

Figure 36:
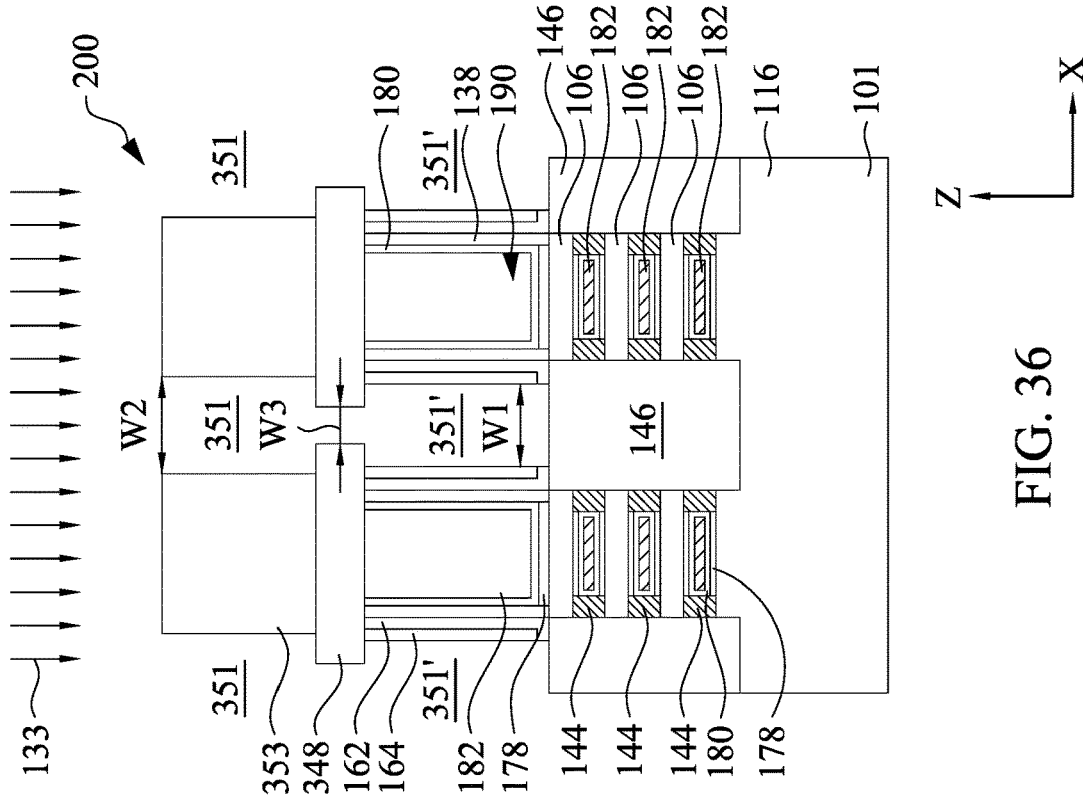

In FIG. 36, the treated surfaces of the second ILD layer 353 and the hard mask layer 348 are subjected to an etch process 133. The etch process 133 may be a dry etch, a wet etch, or a combination thereof. In one embodiment, the etch process is an isotropic etch process. The etch process 133 removes portions of the second ILD layer 353, the hard mask layer 348, and the first ILD layer 164. The etch process 133 forms openings 351' in the first ILD layer 164 and makes the openings 351' and the openings 351 fluidly connected. The isotropic etch process uses etchants that selectively removes the first and second ILD layers 164, 353 but does not significantly remove the hard mask layer 348. Since the etch selectivity between the second ILD layer 353 and the hard mask layer 348 was enhanced by the treatment process 131, the second ILD layer 353 is etched at a rate faster than that of the hard mask layer 348. In addition, the first ILD layers 164 is also etched at a rate faster than that of the second ILD layer 353 because the majority of the first ILD layer 164 was not treated. As a result, the openings 351' in the first ILD layer 164 are widened with a width W1 greater than the width W2 of the openings 351 in the second ILD layer 353. The openings 351 in the hard mask layer 348 are widened with a width W3, and the width W3 is less than the width W2.

In some embodiments, a portion of the first ILD layer 164 remains on sidewall of the CESL 162 after the isotropic etch process. In some embodiments, a portion of the CESL 162 is also removed so that the openings 351' exposes the top surface of the epitaxial S/D features 146. In some embodiments, the first ILD layer 164 is fully removed. In either case, the exposed surface of the first ILD layer 164 (if present) may have a first concentration of nitrogen, while the treated second ILD layer 353 and the hard mask layer 348 may have a second concentration of nitrogen greater than the first concentration of nitrogen due to the treatment process 131.

Figure 37:
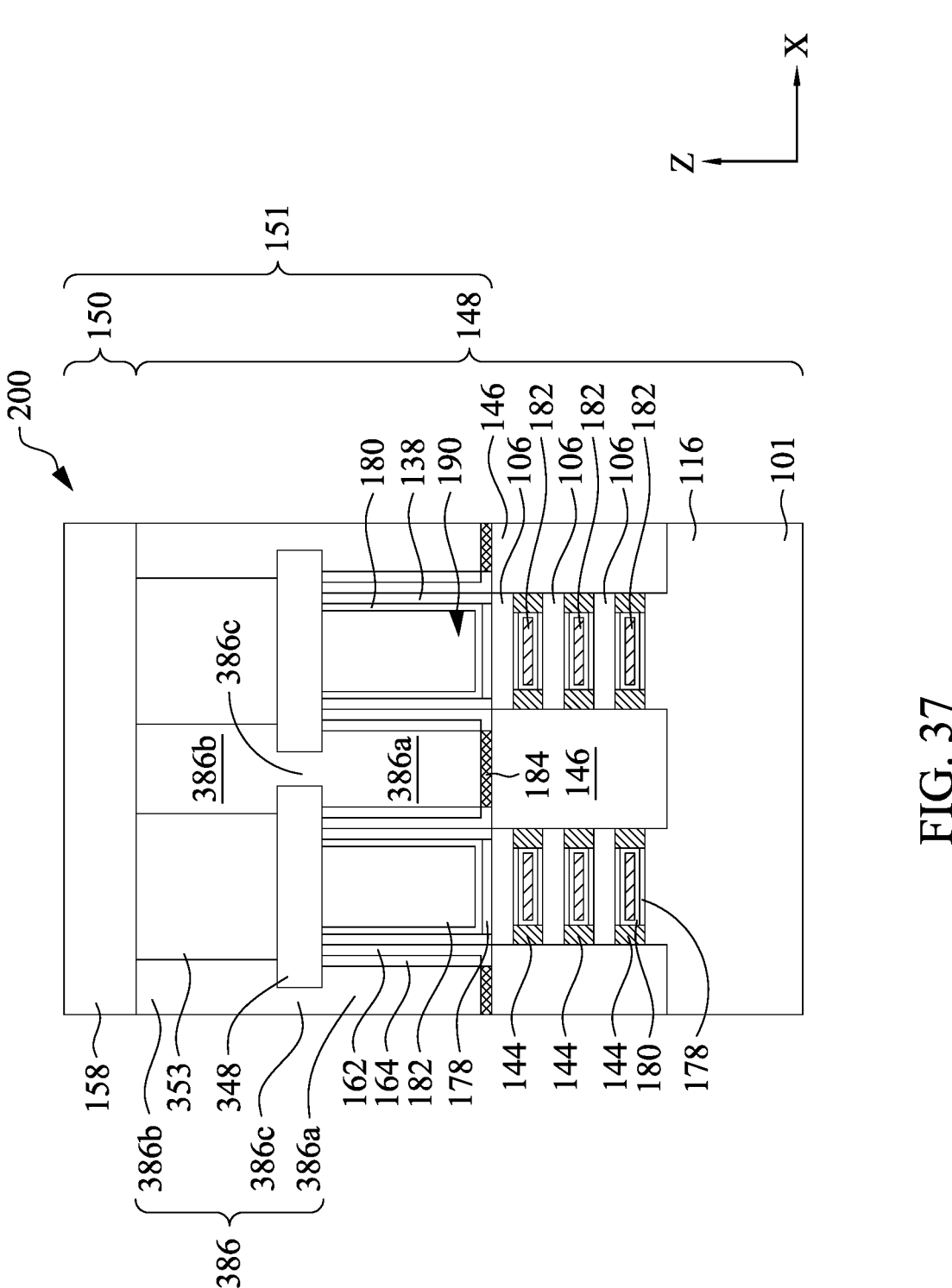

In FIG. 37, a silicide layer 184 is formed on the epitaxial S/D features 146. The silicide layer 184 conductively couples the epitaxial S/D features 146 to the subsequently formed S/D contacts 386. The silicide layer 184 may be formed by depositing a metal source layer over the epitaxial S/D features 146 and performing a rapid thermal annealing process. During the rapid anneal process, the portion of the metal source layer over the epitaxial S/D features 146 reacts with silicon in the epitaxial S/D features 146 to form the silicide layer 184. Unreacted portion of the metal source layer is then removed. The silicide layer 184 may be made of a material including one or more of WSi, CoSi, NiSi, TiSi, MoSi and TaSi. In some embodiments, the silicide layer 184 is made of a metal or metal alloy silicide, and the metal includes a noble metal, a refractory metal, a rare earth metal, alloys thereof, or combinations thereof.

Next, a conductive material is deposited in the openings 351, 351' (FIG. 36) to form the S/D contacts 386. Thereafter, an interconnect structure layer 150 is formed over the semiconductor device structure 200. The conductive material may be made of a material including one or more of Ru, Mo, Co, Ni. W, Ti, Ta, Cu, Al, TiN and TaN. While not shown, a barrier layer (e.g., TiN, TaN, or the like) may be formed on sidewalls of the contact openings prior to forming the S/D contacts 386. Then, a planarization process, such as CMP, is performed to remove excess deposition of the contact material and expose the top surface of the second ILD layer 353. The S/D contacts 386 as formed have a lower portion 386*a* having a first dimension or width substantially equal to the width W1 (FIG. 36), an upper portion 386*b* having a second dimension or width substantially equal to the width W2 (FIG. 36), and a middle portion 386*c* having a third dimension or width substantially equal to the width W3 (FIG. 36). The middle portion 386*c* with a smaller width can decrease gate-induced source/drain contact leakage due to greater separation between the gate electrode layer 182 and the S/D contacts 386. The upper and lower portions 386*b*, 386*a* with a larger width can reduce contact resistance for the semiconductor device structure 100. In some embodiments, each S/D contact 386 is in contact with the treated second ILD layer 353, the treated hard mask layer 348, the first ILD layer 164 (untreated), and the silicide layer 184. In some embodiments where the first ILD layer 164 was removed during the formation of the contact opening for the S/D contacts 386, each S/D contact 386 is in contact with the treated second ILD layer 353, the treated hard mask layer 348, and the silicide layer 184.

Various embodiments of the present disclosure provide a semiconductor device structure with reduced gate-induced source/drain contact leakage by forming a protective structure over the gate. The protective structure includes a hard mask layer, an oxide layer, and an etch stop layer, and the protective structure can function like a self-aligned contact (SAC) for the replacement gate structure. Particularly, the protective structure is formed by a direct contact patterning process without recessing the gate material. With this approach, the contact-to-gate shorts is minimized or avoided since the gate is physically separated from the S/D contact by the protective structure, the second ILD layer 153, the first ILD layer 164, the CESL 162, and the gate spacer 138. Since this approach does not require recessing the gate electrode layer, which may result in residues of the gate material being left at the periphery of the SAC structure and create a short between the contact and the gate. The protective structure enables aggressive scaling of the contact poly pitch while minimizing yield loss due to contact landing misalignment.

An embodiment is a semiconductor device structure. The semiconductor device structure includes a gate electrode layer having a sidewall surrounded by a gate dielectric layer, a first interlayer dielectric (ILD) layer disposed adjacent the gate dielectric layer, a first etch stop layer disposed between the gate dielectric layer and the first ILD layer, a second etch stop layer disposed above and in contact with the gate electrode layer, the gate dielectric layer, and the first etch stop layer, an oxide layer disposed above and in contact with the second etch stop layer, a hard mask layer disposed above and in contact with the oxide layer, a second ILD layer disposed above and in contact with the second etch stop layer, and a source/drain contact disposed over a source/drain feature, the source/drain contact extending through the second ILD layer, the second etch stop layer, and the first ILD layer.

Another embodiment is a semiconductor device structure. The semiconductor device structure includes a first source/ drain feature, a source/drain contact disposed over the first source/drain feature, comprising an upper portion having a first width, a lower portion having a second width different than the first width, and a middle portion disposed between the upper portion and the lower portion, the middle portion having a third width different than the second width. The semiconductor device structure also includes a gate electrode layer disposed adjacent to the lower portion of the source/drain contact, a hard mask layer disposed above and in contact with the gate electrode layer and the middle portion of the source/drain contact, and a first interlayer dielectric (ILD) layer disposed above and in contact with the hard mask layer and the upper portion of the source/drain contact.

A further embodiment is a method for forming a semiconductor device structure. The method includes forming a source/drain feature adjacent to a fin structure, wherein the fin structure comprises a plurality of semiconductor layers parallelly stacked, forming a first etch stop layer on the source/drain feature, forming a first interlayer dielectric (ILD) layer on the first etch stop layer, surrounding a portion of the plurality of semiconductor layers with a gate electrode layer, forming a hard mask layer over the gate electrode layer, forming a second ILD layer on the hard mask layer, patterning the second ILD layer and the hard mask layer to form an opening exposing a portion of the first ILD layer, exposing the second ILD layer, the hard mask layer, and the first ILD layer to an etch process to form a contact opening in the first ILD layer exposing a portion of the source/drain feature, depositing a conductive material in the contact opening and on the hard mask layer, and planarizing the conductive material until the hard mask layer is exposed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
   a gate electrode layer having a sidewall surrounded by a gate dielectric layer;
   a first interlayer dielectric (ILD) layer disposed adjacent the gate dielectric layer;
   a first etch stop layer disposed between the gate dielectric layer and the first ILD layer;
   a second etch stop layer disposed above and in contact with the gate electrode layer, the gate dielectric layer, and the first etch stop layer;
   an oxide layer disposed above and in contact with the second etch stop layer;
   a hard mask layer disposed above and in contact with the oxide layer;
   a second ILD layer disposed above and in contact with the second etch stop layer; and
   a source/drain contact disposed over a source/drain feature, the source/drain contact extending through the second ILD layer, the second etch stop layer, and the first ILD layer.

2. The semiconductor device structure of claim 1, wherein the second etch stop layer and the hard mask layer comprise a nitrogen-containing material.

3. The semiconductor device structure of claim 2, wherein the second etch stop layer and the hard mask layer comprises a material chemically different from each other.

4. The semiconductor device structure of claim 1, wherein the hard mask layer has a first thickness and the second etch stop layer has a second thickness less than the first thickness.

5. The semiconductor device structure of claim 4, wherein the second thickness and the first thickness have a ratio of about 1:6 to about 1:20.

6. The semiconductor device structure of claim 1, wherein the source/drain contact further comprises:

an upper portion in contact with the hard mask layer; and a lower portion in contact with the oxide layer, the second etch stop layer, and the first ILD layer, wherein a central line extending through the upper portion is shifted by an offset from a central line extending through the lower portion.

7. The semiconductor device structure of claim 6, wherein a portion of the upper portion is in contact with a top surface of the oxide layer.

8. The semiconductor device structure of claim 1, wherein a top surface of the second ILD layer, a top surface of the hard mask layer, and a top surface of the source/drain contact are substantially co-planar.

9. The semiconductor device structure of claim 1, wherein the second ILD layer is in contact with a top surface and a sidewall of the hard mask layer.

10. The semiconductor device structure of claim 9, wherein a top surface of the second ILD layer and a top surface of the source/drain contact are substantially co-planar.

11. A semiconductor device structure, comprising:

a first source/drain feature;

a source/drain contact disposed over the first source/drain feature, comprising:

an upper portion having a first width;

a lower portion having a second width greater than the first width; and a middle portion disposed between the upper portion and the lower portion, the middle portion having a third width smaller than the second width;

a gate electrode layer disposed adjacent to the lower portion of the source/drain contact;

a hard mask layer disposed above and in contact with the gate electrode layer and the middle portion of the source/drain contact; and a first interlayer dielectric (ILD) layer disposed above and in contact with the hard mask layer and the upper portion of the source/drain contact.

12. The semiconductor device structure of claim 11, further comprising:

a second ILD layer disposed between the gate electrode layer and the lower portion of the source/drain contact.

13. The semiconductor device structure of claim 12, wherein the first ILD layer has a first concentration of nitrogen and the second ILD layer has a second concentration of nitrogen different than the first concentration of nitrogen.

14. The semiconductor device structure of claim 13, wherein the second concentration of nitrogen is lower than the first concentration of nitrogen.

15. The semiconductor device structure of claim 11, wherein a top surface of the first ILD layer and a top surface of the upper portion of the source/drain contact are substantially co-planar.

16. The semiconductor device structure of claim 11, further comprising:

an etch stop layer disposed between the gate electrode layer and the lower portion of the source/drain contact, and the etch stop layer is in contact with the lower portion of the source/drain contact.

17. A method for forming a semiconductor device structure, comprising:

forming a source/drain feature adjacent to a fin structure, wherein the fin structure comprises a plurality of semiconductor layers parallelly stacked;

forming a first etch stop layer on the source/drain feature;

forming a first interlayer dielectric (ILD) layer on the first etch stop layer;

surrounding a portion of the plurality of semiconductor layers with a gate electrode layer;

forming a hard mask layer over the gate electrode layer;

forming a second etch stop layer between the gate electrode layer and the hard mask layer;

forming a second ILD layer on the hard mask layer;

patterning the second ILD layer and the hard mask layer to form an opening exposing a portion of the first ILD layer;

exposing the second ILD layer, the hard mask layer, and the first ILD layer to an etch process to form a contact opening in the first ILD layer exposing a portion of the source/drain feature;

depositing a conductive material in the contact opening and on the hard mask layer; and planarizing the conductive material until the hard mask layer is exposed.

18. The method of claim 17, further comprising:

after patterning the hard mask layer, subjecting the second ILD layer and the hard mask layer to a material modification process.

19. The method of claim 18, wherein the conductive material in the contact opening comprises:

an upper portion having a first width;

a lower portion having a second width different than the first width; and a middle portion disposed between the upper portion and the lower portion, the middle portion having a third width different than the second width.

20. The method of claim 18, wherein the material modification process is a nitrogen-based plasma.

* * * * *